United States Patent
Liaw

(10) Patent No.: US 9,613,953 B2
(45) Date of Patent: Apr. 4, 2017

(54) SEMICONDUCTOR DEVICE, SEMICONDUCTOR DEVICE LAYOUT, AND METHOD OF MANUFACTURING SEMICONDUCTOR DEVICE

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 10 days.

(21) Appl. No.: 14/666,444

(22) Filed: Mar. 24, 2015

(65) Prior Publication Data

US 2016/0284695 A1  Sep. 29, 2016

(51) Int. Cl.

| H01L 27/088 | (2006.01) |
| H01L 27/02 | (2006.01) |
| H01L 29/06 | (2006.01) |
| H01L 29/66 | (2006.01) |
| H01L 21/8234 | (2006.01) |

(52) U.S. Cl.
CPC .... *H01L 27/088* (2013.01); *H01L 21/823437* (2013.01); *H01L 27/0207* (2013.01); *H01L 29/0649* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| 8,421,205 B2 | 4/2013 | Yang |
| 8,661,389 B2 | 2/2014 | Chern et al. |
| 8,698,205 B2 | 4/2014 | Tzeng et al. |
| 8,735,991 B2 * | 5/2014 | Shieh ............... H01L 21/82341 257/374 |
| 8,765,546 B1 * | 7/2014 | Hung ............... H01L 21/82343 257/190 |
| 8,826,212 B2 | 9/2014 | Yeh et al. |
| 8,836,141 B2 | 9/2014 | Chi et al. |
| 9,368,626 B2 * | 6/2016 | Chang ............... H01L 29/7843 |
| 9,437,614 B1 * | 9/2016 | Lee .................... H01L 27/1207 |
| 2013/0140639 A1 * | 6/2013 | Shieh ............... H01L 21/82341 257/368 |
| 2014/0215420 A1 | 7/2014 | Lin et al. |
| 2014/0252479 A1 * | 9/2014 | Utomo ................ H01L 29/785 257/347 |
| 2014/0264924 A1 | 9/2014 | Yu et al. |
| 2014/0282289 A1 | 9/2014 | Hsu et al. |
| 2014/0325466 A1 | 10/2014 | Ke et al. |
| 2014/0327080 A1 * | 11/2014 | Hung ............... H01L 29/66515 257/365 |

(Continued)

*Primary Examiner* — Lex Malsawma
(74) *Attorney, Agent, or Firm* — Hauptman Ham, LLP

(57) ABSTRACT

A layout of a semiconductor device is stored on a non-transitory computer-readable medium. The layout includes an active area region extending in a first direction, a gate electrode extending in a second direction and crossing the active area region, and a dummy gate extending in the second direction. The dummy gate is adjacent the gate electrode. The dummy gate is a dielectric dummy gate.

20 Claims, 16 Drawing Sheets

(56) References Cited

U.S. PATENT DOCUMENTS

| | | | |
|---|---|---|---|
| 2015/0014780 A1* | 1/2015 | Kim | H01L 27/0924 257/369 |
| 2015/0206885 A1* | 7/2015 | Barth, Jr. | H01L 27/10826 257/301 |
| 2016/0111430 A1* | 4/2016 | Liaw | H01L 27/1104 257/384 |
| 2016/0260833 A1* | 9/2016 | Basker | H01L 29/7853 |

* cited by examiner

SEMICONDUCTOR DEVICE, SEMICONDUCTOR DEVICE LAYOUT, AND METHOD OF MANUFACTURING SEMICONDUCTOR DEVICE

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure production yield and intended performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
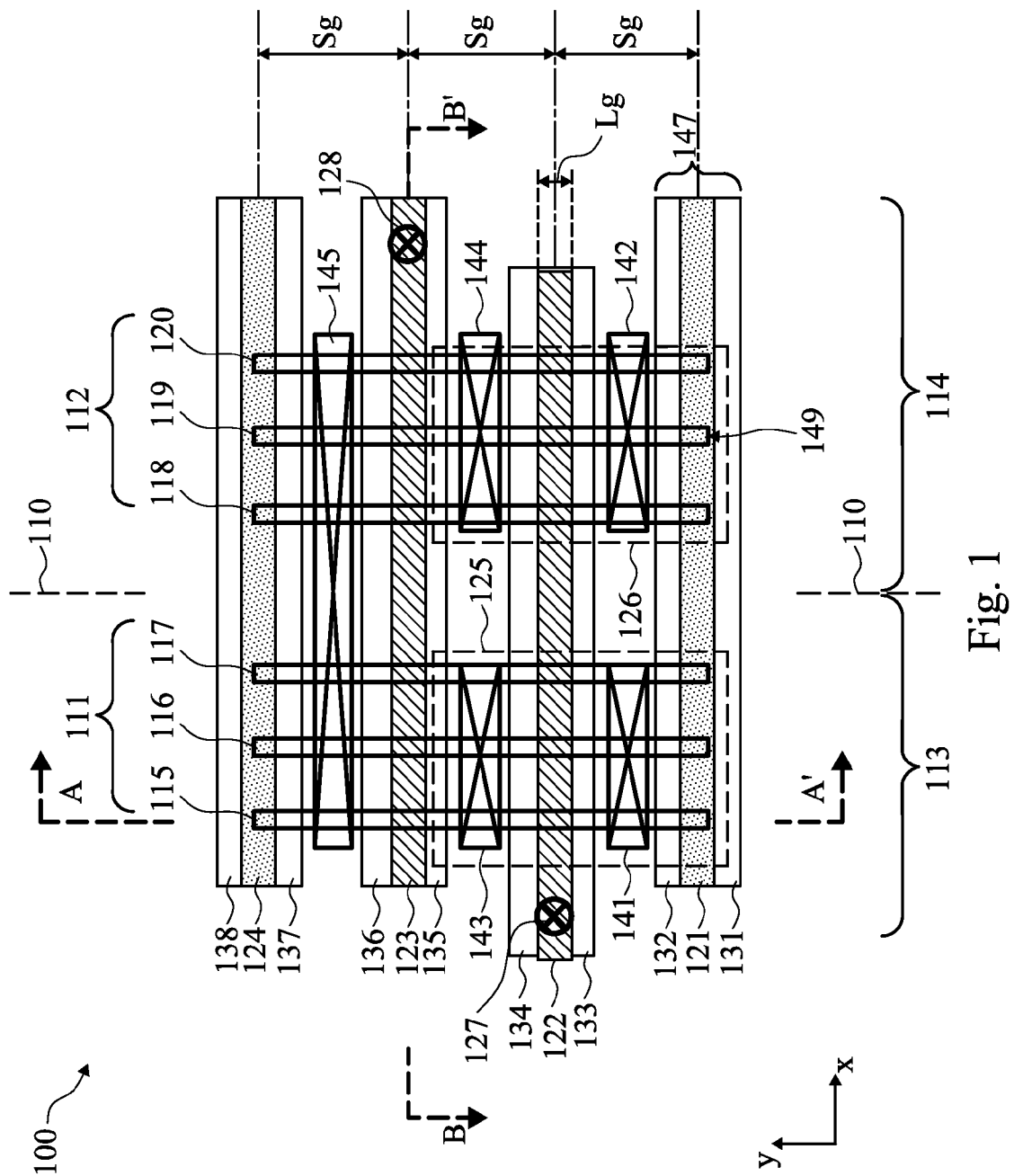
FIG. 1 is a top view of a layout of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

In some embodiments, dummy gates are formed alongside gate electrodes in a semiconductor device to provide a fully dense gate environment for facilitating epitaxial growth of source/drain (S/D) regions. In at least one embodiment, at least some of the dummy gates are formed of a dielectric material to reduce capacitances which, in turn, reduces power consumption and improves performance of the semiconductor device. In at least one embodiment, dielectric dummy gates formed over ends of active area regions reduce gate dielectric breakdown risks, thereby improving reliability.

FIG. 1 is a top view of a layout 100 of a semiconductor device, in accordance with some embodiments. The layout 100 comprises a plurality of active area regions 111, 112, a plurality of gate electrodes 122, 123, a plurality of dummy gates 121, 124, a plurality of spacers 131, 132, 133, 134, 135, 136, 137, 138, and a plurality of contact areas 141, 142, 143, 144, 145.

The active area regions 111, 112 extend along a first direction of the layout 100, e.g., the Y direction. In some embodiments, the active area regions 111, 112 are also referred to as oxide-definition (OD) regions. Example materials of the active area regions 111, 112 include, but are not limited to, semiconductor materials doped with various types of p-dopants and/or n-dopants. In at least one embodiment, the active area regions 111, 112 include dopants of the same type. In at least one embodiment, one of the active area regions 111, 112 comprises dopants of a type different from a type of dopants of another one of the active area regions 111, 112. The active area regions 111, 112 are isolated from each other by one or more isolation structures as described herein. The active area regions 111, 112 are within corresponding well regions. For example, the active area region 111 is within a well region 113 which is an n-well region in one or more embodiments, and the active area region 112 is within a well region 114 which is a p-well region in one or more embodiments. The described conductivity of the well regions 113, 114 is an example. Other arrangements are within the scope of various embodiments.

The n-well region 113 and the p-well region 114 are on opposite sides of an imaginary line 110 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 1, the n-well region 113 is a region for forming p-channel metal-oxide semiconductor (PMOS) transistors, and the p-well region 114 is a region for forming n-channel metal-oxide semiconductor (NMOS) transistors. Each of the active area regions 111, 112 comprises one or more fins to form FinFETs. For example, the active area region 111 comprises three fins 115, 116, 117, and the active area region 112 comprises three fins 118, 119, 120. The fins 116, 117, 118, 119 are isolated from each other by one or more isolation structures as described herein. Other numbers of fins in each of the active area regions 111, 112 are within the scope of various embodiments. The described FinFET configuration is an example. Other arrangements are within the scope of various embodiments. For example, in one or more embodiments, the active area regions 111, 112 do not include fins and are configured for forming planar MOSFET transistors.

The gate electrodes 122, 123 extend along a second direction of the layout 100, e.g., the X direction, across the active area regions 111, 112. Example materials of the gate electrodes 122, 123 include, but are not limited to, polysilicon and metal. Other materials are within the scope of various embodiments. The gate electrodes 122, 123 and the corresponding active area regions 111, 112 form one or more transistors in the layout 100. In the example configuration in FIG. 1, a transistor 125 is formed by the gate electrode 122 and the active area region 111. A gate of the transistor 125 is formed by the gate electrode 122. One of a drain or a source (referred to herein as "source/drain" or "S/D") of the transistor 125 is defined by a region of the active area region 111 on one side (e.g., the upper side in FIG. 1) of the gate electrode 122. The other source/drain of the transistor 125 is defined by another region of the active area region 111 on the opposite side (e.g., the lower side in FIG. 1) of the gate electrode 122. For another example, a further transistor 126 is formed by the gate electrode 122 and the active area region 112. In at least one embodiment, further transistors are formed by the gate electrode 123 and the corresponding active area regions 111, 112. One or more of the gate electrodes 122, 123 are coupled to other circuitry of the semiconductor device by corresponding gate contacts. For example, gate contacts 127, 128 are configured on the corresponding gate electrodes 122, 123 for coupling the corresponding gate electrodes 122, 123 to other circuitry.

The dummy gates 121, 124 extend along the second direction of the layout 100, e.g., the X direction, across the active area regions 111, 112. The dummy gates 121, 124 are dielectric dummy gates comprising one or more dielectric materials. Example dielectric materials of the dummy gates 121, 124 include, but are not limited to, oxide-based dielectric materials, such as SiO2, SiON, Si3N4, SiOCN and combinations thereof. In at least one embodiment, the gate electrodes 122, 123 include one or more metal materials, and the dummy gates 121, 124 are free of the metal materials of the gate electrodes 122, 123.

In some embodiments, a width of a gate electrode is equal to a corresponding width of a dummy gate. For example, a width Lg of at least one of the gate electrodes 122, 123 in the Y direction is equal to a corresponding width of at least one of the dummy gates 121, 124. For the gate electrodes 122, 123, the width Lg is also referred to as a gate length between the source/drains of the corresponding transistors. In at least one embodiment, all of the dummy gates 121, 124 and the gate electrodes 122, 123 have the same width Lg in the Y direction. In at least one embodiment, the width of at least one of the dummy gates 121, 124 in the Y direction is less than 35 nm (nanometers).

In some embodiments, a distance between a dummy gate and an adjacent gate electrode is equal to a corresponding distance between the gate electrodes. For example, a center-to-center distance, or spacing, in the Y direction between one of the dummy gates 121, 124 and the adjacent gate electrode 122 or 123 is equal to a spacing in the Y direction between the gate electrodes 122, 123. In at least one embodiment, all of the dummy gates 121, 124 and the gate electrodes 122, 123 are spaced from each other by a same spacing Sg.

The spacers 131, 132, 133, 134, 135, 136, 137, 138 are arranged along sides of the corresponding gate electrodes and dummy gates. For example, the spacers 131, 132 are arranged along longitudinal sides of the dummy gate 121 in the X direction, the spacers 133, 134 are arranged along longitudinal sides of the gate electrode 122, the spacers 135, 136 are arranged along longitudinal sides of the gate electrode 123, and the spacers 137, 138 are arranged along longitudinal sides of the dummy gate 124. The spacers 131, 132, 133, 134, 135, 136, 137, 138 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 131, 132, 133, 134, 135, 136, 137, 138 have a tapered profile as described herein.

Each of the dummy gates and the corresponding spacers configure a dummy gate region, and at least one active area region terminates in the dummy gate region. For example, the dummy gate 121 and the corresponding spacers 131, 132 configure a dummy gate region 147. The active area regions 111, 112 terminate in the dummy gate region 147. For example, the fin 119 terminates at a lower end 149 in the dummy gate region 147. Similarly, the active area regions 111, 112 terminate in a dummy gate region configured by the dummy gate 124 and the corresponding spacers 137, 138. In the example configuration in FIG. 1, the ends of the fins 115-120 are under the dummy gate 121. Other arrangements are within the scope of various embodiments. For example, in one or more embodiments, at least one of the fins 115-120 has an end at an upper edge of the dummy gate 121, or at a lower edge of the dummy gate 121, or under the spacer 131, or under the spacer 132.

The contact areas 141, 142, 143, 144, 145 overlap the corresponding active area regions 111, 112. For example, the contact areas 141, 143, 145 overlap the active area region 111, and the contact areas 142, 144, 145 overlap the active area region 112. The contact areas 141, 142, 143, 144, 145 are configured to electrically couple the underlying source/drains of the corresponding transistors with each other or with other circuitry of the semiconductor device. For example, the contact areas 141, 142, 143, 144 are configured to electrically couple the underlying source/drains of the corresponding transistors with other circuitry of the semiconductor device, whereas the contact area 145 is configured to electrically couple the underlying source/drains of the corresponding transistors.

In the example configuration in FIG. 1, boundaries of one or more of the contact areas 141, 142, 144, 145 are spaced from boundaries of the spacers 131, 132, 133, 134, 135, 136, 137, 138. For example, an upper edge of the contact area 145 is spaced in the Y direction from an adjacent lower edge of the spacer 137, and a lower edge of the contact area 145 is spaced in the Y direction from an adjacent upper edge of the spacer 136. Other arrangements are within the scope of various embodiments. For example, in one or more embodiments described herein with respect to FIGS. 2, 2A and 2B, one or more of the contact areas are self-aligned contacts (SAC) having boundaries defined at least partially by boundaries of the spacers 131, 132, 133, 134, 135, 136, 137, 138.

In some embodiments, the layout 100 is represented by a plurality of masks generated by one or more processors and/or stored in one or more non-transitory computer-readable media. Other formats for representing the layout 100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 100 is presented by at least one first mask corresponding to the active area regions 111, 112, at least one second mask corresponding to the gate electrodes 122, 123, at least one third mask corresponding to the dummy gates 121, 124, and at least one fourth mask corresponding to the spacers 131, 132, 133, 134, 135, 136, 137, 138.

Figure 1A:
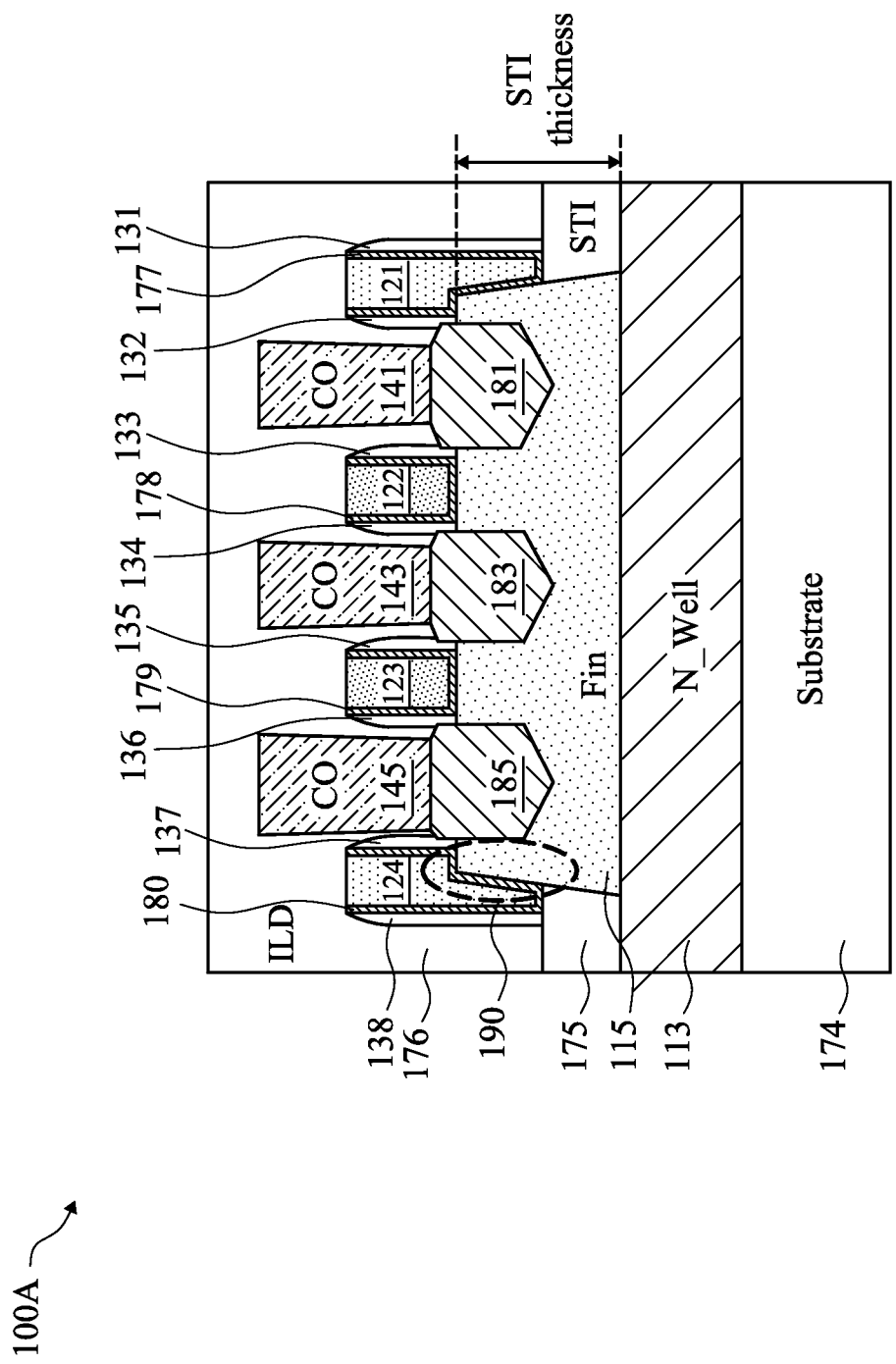
FIG. 1A is a cross-section view of a semiconductor device taken along line A-A' in FIG. 2 in accordance with some embodiments.
Figure 1B:
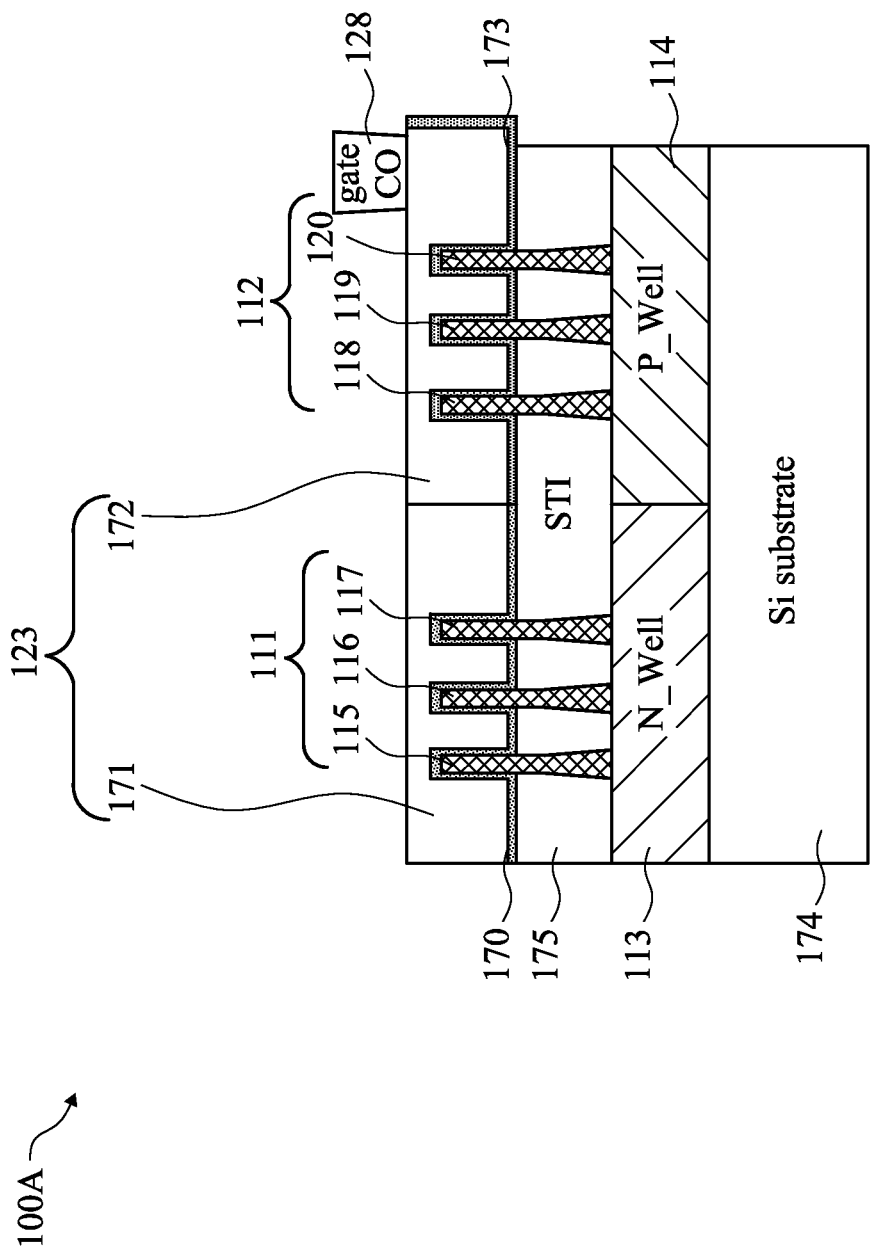
FIG. 1B is a cross-section view of the semiconductor device taken along line B-B' in FIG. 2 in accordance with some embodiments.

FIGS. 1A and 1B are cross-section views of a semiconductor device 100A having the layout 100. The cross-section view in FIG. 1A is taken along line A-A' in FIG. 1. The cross-section view in FIG. 1B is taken along line B-B' in FIG. 1. The configuration of the semiconductor device 100A is described herein with respect to both FIG. 1A and FIG. 1B.

As illustrated in FIGS. 1A and 1B, the semiconductor device 100A comprises a substrate 174 over which various elements of the semiconductor device 100A are formed. The elements of the semiconductor device 100A include active elements and/or passive elements. In at least one embodiment, active elements are arranged in a circuit region of the semiconductor device to provide one or more functions and/or operations intended to be performed by the semiconductor device. In at least one embodiment, the semiconductor device further comprises a non-circuit region, e.g., a sealing region, that extends around and protects the circuit region. Examples of active elements include, but are not limited to, transistors and diodes. Examples of transistors are described herein with respect to FIG. 1. Examples of passive elements include, but are not limited to, capacitors, inductors, fuses, and resistors. A plurality of metal layers and via layers are alternatingly formed over the substrate 174 to electrically couple the elements of the semiconductor device 100A with each other and/or with external devices. The substrate 174 comprises, in at least one embodiment, a silicon substrate. The substrate 174 comprises, in at least one embodiment, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 174 further includes one or more other features, such as various doped regions, a buried layer, and/or an epitaxy (epi) layer. In some embodiments, the substrate 174 comprises a semiconductor on insulator, such as silicon on insulator (SOI). In some embodiments, the substrate 174 includes a doped epi layer, a gradient semiconductor layer, and/or a semiconductor layer overlying another semiconductor layer of a different type such as a silicon layer on a silicon germanium layer.

The semiconductor device 100A further comprises one or more well regions over the substrate 174. In the example configuration in FIG. 1B, the n-well region 113 and p-well region 114 are over the substrate 174, as described with respect to FIG. 1.

The semiconductor device 100A further comprises one or more isolation structures over and around the well regions 113, 114. In the example configuration in FIGS. 1A and 1B, the isolation structure 175 is over the well regions 113, 114. The isolation structure 175 electrically isolates various elements of the semiconductor device 100A from each other.

For example, as illustrated in FIG. 1B, the isolation structure 175 electrically isolates the fins 115-117 in the active area region 111 from the fins 118-120 in the active area region 112. In the cross-section in FIG. 1A, the isolation structure 175 has a thickness less than the fin 115; however, outside the cross-section shown in FIG. 1A, the isolation structure 175 includes regions where the thickness of the isolation structure 175 is higher, as indicated by the arrow designated with "STI thickness" in FIG. 1A. In at least one embodiment, the isolation structure 175 comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

The semiconductor device 100A further comprises active area regions, gate electrodes, dummy gates, and corresponding spacers over the isolation structure. In the example configuration in FIGS. 1A and 1B, the semiconductor device 100A further comprises active area regions 111, 112 (best seen in FIG. 1B), gate electrodes 122, 123, dummy gates 121, 124, and corresponding spacers 131, 132, 133, 134, 135, 136, 137, 138 (best seen in FIG. 1A) over the isolation structure 175. In the example configuration in FIG. 1A, the gate electrodes 122, 123, the dummy gates 121, 124, and the corresponding spacers 131, 132, 133, 134, 135, 136, 137, 138 are over the isolation structure 175. Other arrangements are within the scope of various embodiments. For example, in one or more embodiments, the gate electrodes 122, 123 and/or the dummy gates 121, 124 and/or one or more of the corresponding spacers 131, 132, 133, 134, 135, 136, 137, 138 are partially embedded in the isolation structure 175.

The semiconductor device 100A further comprises an inter-layer dielectric (ILD) layer over the isolation structure. In the example configuration in FIG. 1A, the semiconductor device 100A comprises an inter-layer dielectric (ILD) layer 176 over the isolation structure 175. Example materials of the ILD layer 176 include, but are not limited to, SiNx, SiOx, SiON, SiC, SiBN, SiCBN, or combinations thereof. For simplicity, the ILD layer 176 is not illustrated in FIG. 1B. The ILD layer 176 embeds therein the gate electrodes 122, 123, and/or the dummy gates 121, 124 and/or the corresponding spacers 131, 132, 133, 134, 135, 136, 137, 138 (as best seen in FIG. 1A). The ILD layer 176 further embeds therein the fins 115-120 of the active area regions 111, 112 and contact plugs in the corresponding contact areas 141, 142, 143, 144, 145. For the sake of simplicity, the contact plugs are designated by the same reference numerals of the corresponding contact areas. Three contact plugs 141, 143, 145 are shown in FIG. 1A with a label "CO." The gate contact 128 is shown in FIG. 1B with a label "gate CO."

The semiconductor device 100A further comprises gate electrodes and gate dielectric layers. In the example configuration in FIGS. 1A-1B, the gate electrodes 122, 123 wraps over the fins 115-120 of the active area regions 111, 112 in regions where the gate electrodes 122, 123 cross over the fins 115-120. To electrically isolate the gate electrodes 122, 123 from the fins 115-120, gate dielectric layers 178, 179 (illustrated in FIG. 1A) are arranged under and around the corresponding gate electrodes 122, 123. The spacers 133, 134, 135, 136 are over opposite sides of the corresponding gate dielectric layers 178, 179. Example materials of the gate dielectric layers include, but are not limited to, a high-k dielectric layer, an interfacial layer, and/or combinations thereof. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, suitable high-k dielectric materials, and/or combinations thereof. In at least one embodiment, a gate dielectric layer includes multi-layer structure of, for example, SiO2 with a high-k dielectric, or SiON with a high-k dielectric.

In some embodiments, the gate electrodes include one or more conductive layers and/or materials. In the example configuration in FIG. 1B, the gate electrode 123 is wrapped over the fins 115-120, and includes a first conductive gate material 171 over the n-well region 113 and a second conductive gate material 172 over the p-well region 114. In at least one embodiment, the conductive gate materials 171, 172 include the same conductive material. In at least one embodiment, the conductive gate materials 171, 172 include different conductive materials. In at least one embodiment, the conductive material or materials of at least one of the conductive gate materials 171, 172 is/are selected in accordance with the type of device or transistor. For example, each of the conductive gate materials 171, 172 includes a conductive work function layer and a contact layer over the conductive work function layer. In at least one embodiment, the dummy gates 121, 124 are free of materials of the contact layer and the conductive work function layer of the conductive gate materials 171, 172.

In at least one embodiment, the work function layer is configured to have a work function in a range from 4 eV to 5 eV. In some embodiments, the first conductive gate material 171 includes a p-type work function metal (p-metal) for forming a PMOS over the n-well region 113. Example p-metals include, but are not limited to, TiN, TaN, a carbon-doped metal nitride such as TaCN. In some embodiments, the second conductive gate material 172 includes an n-type work function metal (n-metal) for forming an NMOS over the p-well region 114. Example n-metals include, but are not limited to, Ta, TiAl, and TiAlN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The first conductive gate material 171 and the second conductive gate material 172 are isolated from the fins 115-120 by a corresponding gate dielectric layer 170 over the n-well region 113 and a corresponding gate dielectric layer 173 over the p-well region 114. The gate dielectric layers 170 and 173 configure the gate dielectric layer 179 described with respect to FIG. 1A. In at least one embodiment, the gate dielectric layers 170 and 173 include the same dielectric material. In at least one embodiment, the gate dielectric layers 170 and 173 include different dielectric materials. In the example configuration in FIG. 1B, the gate electrode 123 extends continuously from the n-well region 113 into the p-well region 114, and the first conductive gate material 171 is in contact with the second conductive gate material 172. Other arrangements are within the scope of various embodiments. For example, in at least one embodiment, at least one of the gate dielectric layers 170 and 173 is interposed between and electrically isolates the first conductive gate material 171 and the second conductive gate material 172. In at least one embodiment, at least one of the gate dielectric layers 170 and 173 includes one or more of HfO2, Ta2O5 and AL2O3.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a Si3N4/metals/high-K dielectric structure in which the metals are selected from the group consisting of Al/refractory metals, W/refractory metals, Cu/refractory metals, silicide, and combinations thereof.

The semiconductor device 100A further comprises dielectric dummy gates. In the example configuration in FIG. 1A, the semiconductor device 100A comprises dummy gates 121, 124 which are formed of dielectric material. Gate dielectric layers 177, 180 are arranged under and around the corresponding dummy gates 121, 124, and the spacers 131, 132, 137, 138 are over opposite sides of the corresponding gate dielectric layers 177, 180. In at least one embodiment, the gate dielectric layers 177, 180 are omitted, and the dielectric materials of the dummy gates 121, 124 are filled in the spaces between the corresponding spacers 131, 132, 137, 138, and in direct contact with the underlying active area region, e.g., the fin 115. In at least one embodiment, the gate dielectric layers 177, 180 include the same dielectric material as the gate dielectric layers 178, 179. In at least one embodiment, gate dielectric layers 177, 180 include a different dielectric material from the gate dielectric layers 178, 179. As described with respect to FIG. 1 and as illustrated in FIG. 1A, the active area region, e.g., the fin 115, terminates in the dummy gate regions configured by the dummy gates 121, 124 and the corresponding spacers 131, 132, 137, 138. In the example configuration in FIG. 1A, the top surfaces of the dummy gates 121, 124 and the gate electrodes 122, 123 are flush with each other due to, e.g., a planarization process during manufacture. Other arrangements are within the scope of various embodiments.

In the semiconductor device 100A, the contact plugs are arranged in the spaces between adjacent spacers. In the example configuration in FIG. 1A, the contact plug 141 is arranged in the space between adjacent spacers 132, 133. At least one side face of the contact plug 141 is spaced from an adjacent side face of the spacer 132 or 133, by a portion of the ILD layer 176. Other arrangements are within the scope of various embodiments, for example, as described with respect to FIGS. 2 and 2A. In the example configuration in FIG. 1A, the top surfaces of the contact plugs 141, 143, 145 are flush with each other due to, e.g., a planarization process during manufacture. Other arrangements are within the scope of various embodiments.

In the semiconductor device 100A, the contact plugs are in contact with corresponding source/drains. In the example configuration in FIG. 1A, the fin 115 includes source/drains 181, 183, 185 which are in contact with the corresponding contact plugs 141, 143, 145. The source/drains 181, 183, 185 are arranged between adjacent gate electrodes and dummy gates 121, 122, 123, 124. In one or more embodiments, portions of the fin 115 between the adjacent spacers are recessed to form S/D cavities having bottom surfaces lower than the top surface of the fin 115. After the formation of the S/D cavities, source/drains 181, 183, 185 are produced by epi-growing a strained material in the S/D cavities. In at least one embodiment, the lattice constant of the strained material is different from the lattice constant of the substrate 174. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In at least one embodiment, the strained material for an NMOS device comprises SiC, SiP, SiCP, Si, or a combination thereof. In the example configuration in FIG. 1A, upper surfaces of the strained material in the source/drains 181, 183, 185 extend upward above top surface of the fin 115. Other arrangements are within the scope of various embodiments. For example, in at least one embodiment, upper surfaces of the strained material in the source/drains 181, 183, 185 are lower than the top surface of the fin 115.

In some embodiments, the epitaxial growth of the source/drains is facilitated or improved in a fully dense gate environment. Such an environment is achievable when dummy gates are arranged alongside gate electrodes so as to promote epitaxial growth of the source/drains between gate electrodes and adjacent dummy gates. For example, in the example configuration in FIG. 1A, the presence of the dummy gate 121 facilitates epitaxial growth of the source/drain 181 between the dummy gate 121 and the adjacent gate electrode 122. In another example, the presence of the dummy gate 124 facilitates epitaxial growth of the source/drain 183 between the dummy gate 124 and the adjacent gate electrode 123. As a result, circuit density and/or performance improvements are achievable in one or more embodiments.

In some other approaches where dummy gates are formed of conductive material, there is a risk of gate dielectric breakdown and associated reliability concerns. For example, as illustrated in FIG. 1A, the dummy gate 124 overlaps an end of the fin 115 at region 190. When the dummy gate 124 is made of a conductive material, a gate dielectric layer 180 is provided between the conductive dummy gate and the fin 115 for electrical insulation. In some configurations, the fin 115 has a narrow fin width and/or sharp end in the region 190 under the conductive dummy gate. Such a shape of the end of the fin 115 in the region 190 potentially causes an excessive electrical field concentration which, in turn, potentially causes a breakdown of the gate dielectric layer between the fin 115 and the overlying conductive dummy gate. In one or more embodiments, by forming the dummy gate 124 as a dielectric dummy gate, such a risk of gate dielectric breakdown and associated reliability concerns are minimized or avoidable.

Another consideration in other approaches, where dummy gates are formed of conductive material, includes parasitic capacitance. For example, when the dummy gate 124 is made of a conductive material, there is/are one or more parasitic capacitances between the conductive dummy gate and other, adjacent conductive components of the semiconductor device 100A, such as the adjacent gate electrode 123 and the adjacent contact plug 145. Parasitic capacitance potentially increases power consumption and/or reduces operation speed of the semiconductor device 100A. In one or more embodiments, by forming the dummy gate 124 as a dielectric dummy gate, parasitic capacitance is reduced and, as a result, a semiconductor device with increased operation speed and/or reduced power consumption compared to the other approaches is obtainable. In at least one embodiment, one or more of the described effects, such as circuit density, performance and power consumption improvements, are achievable without extra cost and/or area penalty.

Figure 2:
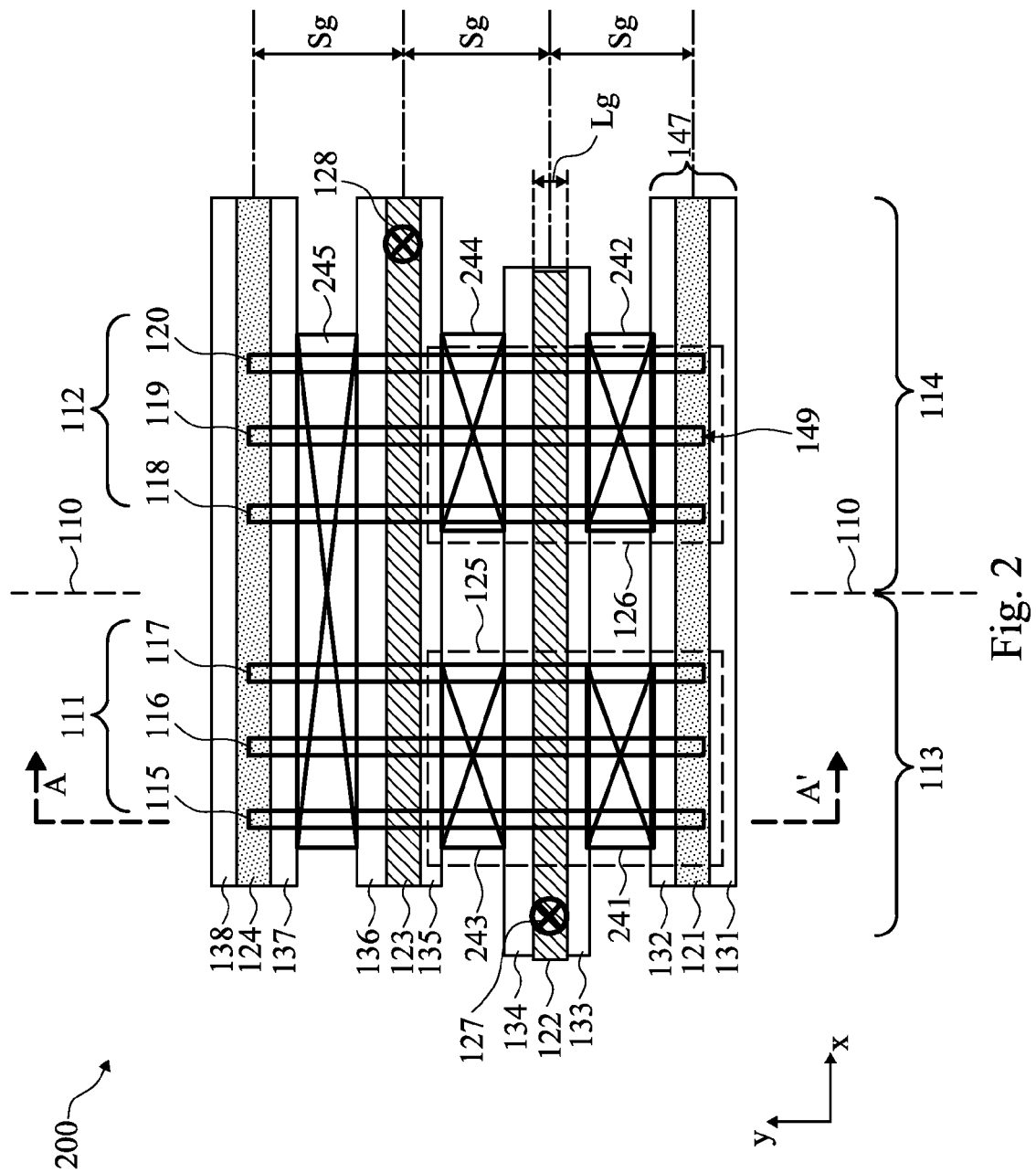
FIG. 2 is a top view of a layout of a semiconductor device, in accordance with some embodiments.
Figure 2A:
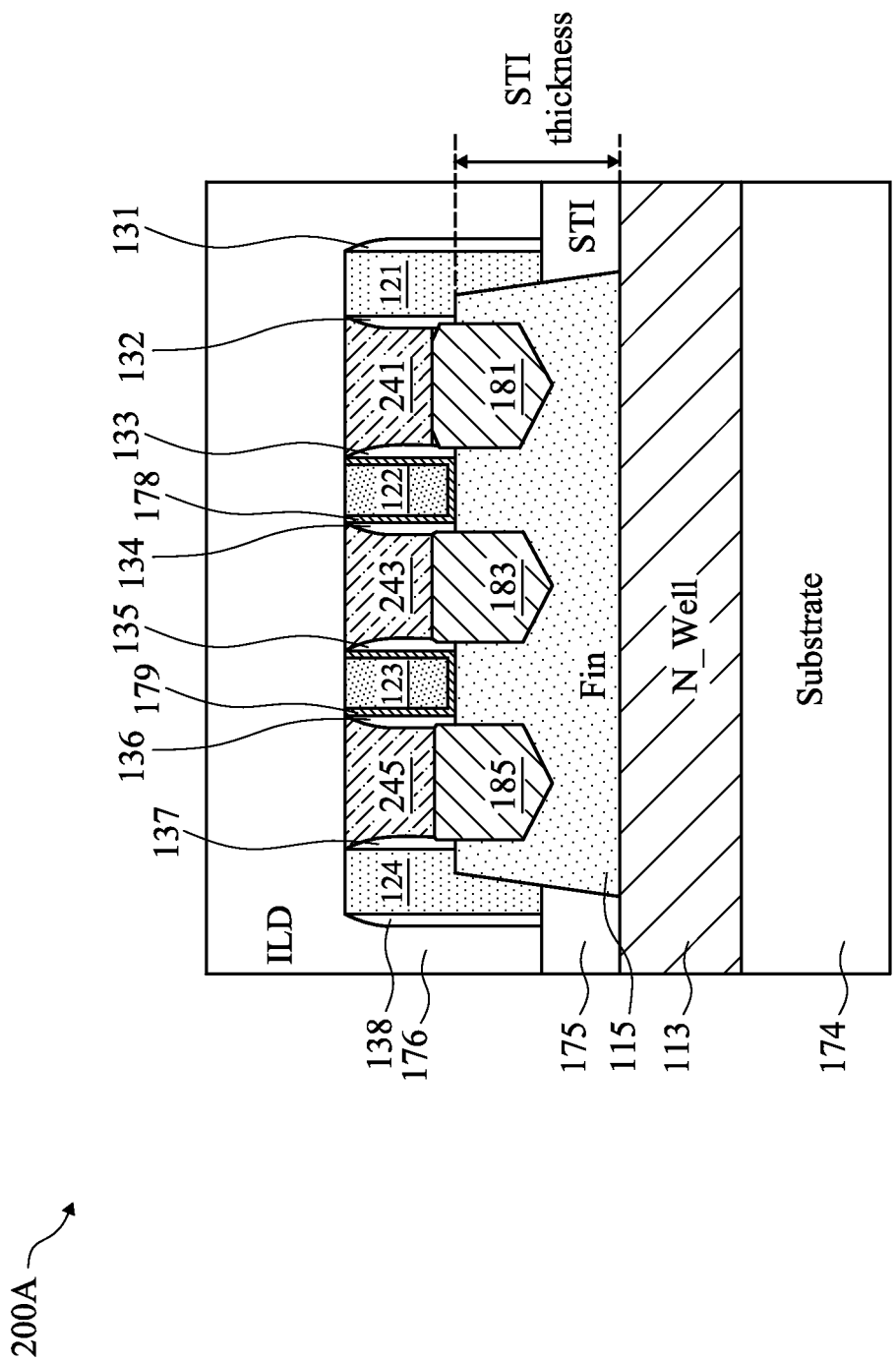
FIG. 2A is a cross-section view of a semiconductor device taken along line A-A' in FIG. 2 in accordance with some embodiments.

FIG. 2 is a top view of a layout 200 of a semiconductor device, in accordance with some embodiments. FIG. 2A is a cross-section view of a semiconductor device 200A taken along line A-A' in FIG. 2 in accordance with some embodiments.

In some embodiments, a difference between the layout 200 in FIG. 2 and the layout 100 in FIG. 1 includes a configuration of contact areas and contact plugs. The layout 200 includes contact areas 241, 242, 243, 244, 245 corresponding to contact areas 141, 142, 143, 144, 145. As described with respect to FIG. 1, the contact areas 141, 142, 143, 144, 145 are spaced from boundaries of the adjacent spacers 131, 132, 133, 134, 135, 136, 137, 138. In the layout 200 of FIG. 2, the contact areas 241, 242, 243, 244, 245 are self-aligned contacts (SAC) having boundaries defined at least partially by boundaries of the spacers 131, 132, 133, 134, 135, 136, 137, 138. For example, as illustrated in FIG. 2, a lower edge of the contact area 245 corresponds to an upper edge of the spacer 136, and an upper edge of the contact area 245 corresponds to a lower edge of the spacer 137. In the example configuration in FIG. 2A, the contact plugs corresponding to the contact areas 241, 243, 245 fill in the spaces between adjacent spacers. For example, the contact plug 245 fills in the space between adjacent spacers 136, 137. In at least one embodiment, a side face of the contact plug 245 directly contacts a corresponding side face of the spacer 136. The opposite side face of the contact plug 245 also directly contacts a corresponding side face of the spacer 137. In the example configuration in FIG. 2A, the spacers 131, 132, 133, 134, 135, 136, 137, 138 have a tapered profile. As a result, some edges of the contact plugs 241, 242, 243, 244, 245 extend over (or overlap) the corresponding spacers 132, 133, 134, 135, 136, 137 in a top plan view, as illustrated in FIG. 2. Configurations and/or manufacturing processes of SACs in accordance with some embodiments are described in U.S. application Ser. No. 14/598,268 (filed Jan. 16, 2015), which is incorporated by reference herein in its entirety.

In the example configuration in FIG. 2A, gate dielectric layers under and around the dummy gates 121, 124 are omitted, and a dielectric material of the dummy gates 121, 124 is in contact with facing faces of the corresponding spacers 131, 132, 137, 138, and also in contact with the fin 115. In some embodiments, one or more effects described with respect to FIGS. 1, 1A and 1B and/or described in U.S. application Ser. No. 14/598,268, are obtained in a semiconductor device having a layout or a configuration described with respect to FIGS. 2 and 2A.

Figure 3:
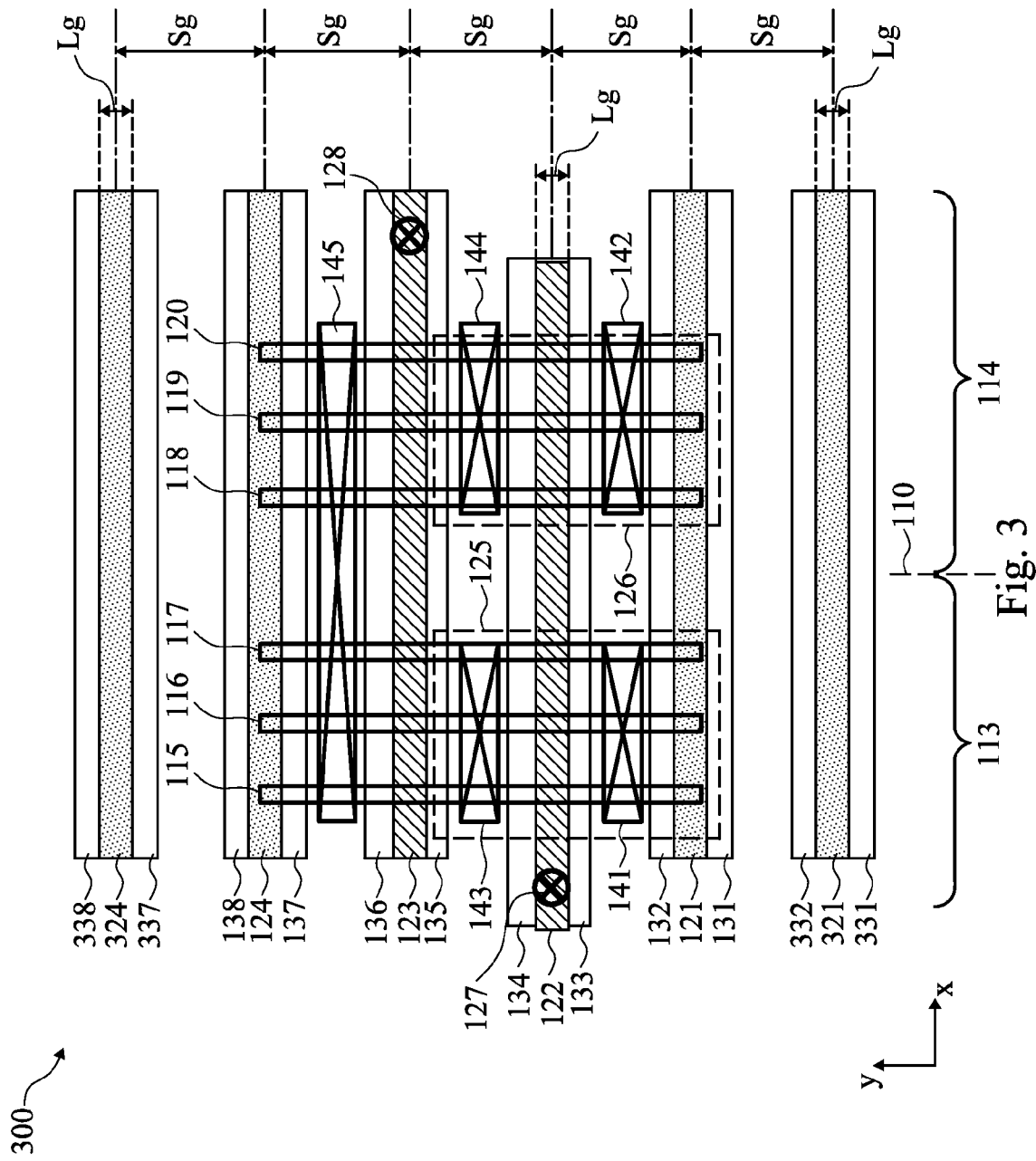
FIG. 3 is a top view of a layout of a semiconductor device, in accordance with some embodiments.

FIG. 3 is a top view of a layout 300 of a semiconductor device, in accordance with some embodiments. In some embodiments, a difference between the layout 300 in FIG. 3 and the layout 100 in FIG. 1 includes one or more additional dummy gates. For example, compared to the layout 100, the layout 300 further comprises dummy gates 321, 324, and corresponding spacers 331, 332, 337, 338 on opposite sides of the dummy gates 321, 324. The dummy gate 321 is adjacent the dummy gate 121, with the dummy gate 121 positioned between the dummy gate 321 and the gate electrode 122. The dummy gate 324 is adjacent the dummy gate 124, with the dummy gate 124 positioned between the dummy gate 324 and the gate electrode 123. In the example configuration in FIG. 3, there is no active area region terminating in a dummy gate region configured by the dummy gate 321 and the corresponding spacers 331, 332, and/or in a dummy gate region configured by the dummy gate 324 and the corresponding spacers 337, 338. In some embodiments, at least one of the dummy gates 321, 324 is omitted. In some embodiments, one or more further dummy gate is arranged adjacent to at least one of the dummy gates 321, 324, e.g., below the dummy gate 321 or above the dummy gate 324 in FIG. 3.

In some embodiments, a width Lg of at least one of the dummy gates 321, 324 in the Y direction is equal to a corresponding width of at least one of the dummy gates 121, 124 and gate electrodes 122, 123. In at least one embodiment, all of the dummy gates 121, 124, 321, 324 and the gate electrodes 122, 123 have the same width Lg in the Y direction. In some embodiments, a center-to-center distance, or spacing, in the Y direction between one of the dummy gates 321, 324 and the adjacent dummy gates 121, 124 is equal to a spacing in the Y direction between the gate electrodes 122, 123. In at least one embodiment, all of the dummy gates 121, 124, 321, 324 and the gate electrodes 122, 123 are spaced from each other by the same spacing Sg.

In the example configuration in FIG. 3, the dummy gates 321, 324 are dielectric dummy gates. In some embodiments, the dummy gates 321, 324 include the same dielectric material as the dummy gates 121, 124. In some embodiments, the dummy gates 321, 324 include a different dielectric material from the dummy gates 121, 124. In at least one embodiment, the dummy gates 321, 324 include an oxide based dielectric and/or a high-k dielectric material.

In some embodiments, at least one of the dummy gates 321, 324 is formed of a conductive material. The conductive dummy gate(s) is/are not configured to be electrically coupled to other circuitry. In some embodiments, the conductive dummy gate(s) include(s) the same conductive material as the gate electrodes 122, 123. For example, in one or more embodiments, the conductive dummy gate(s) is/are manufactured at the same time and by the same processes as the gate electrodes 122, 123. In some embodiments, the conductive dummy gate(s) include(s) a different conductive material from the gate electrodes 122, 123. For example, in one or more embodiments, the conductive dummy gate(s) include(s) a conductive material, e.g., polysilicon, whereas the gate electrodes 122, 123 include one or more metal materials as described herein. In at least one embodiment, the conductive dummy gate(s) include(s) a compound metal material. In some embodiments, one or more effects described with respect to FIGS. 1, 1A, 1B, 2 and 2A are obtained in a semiconductor device having a layout or a configuration described with respect to FIG. 3.

Figure 4:
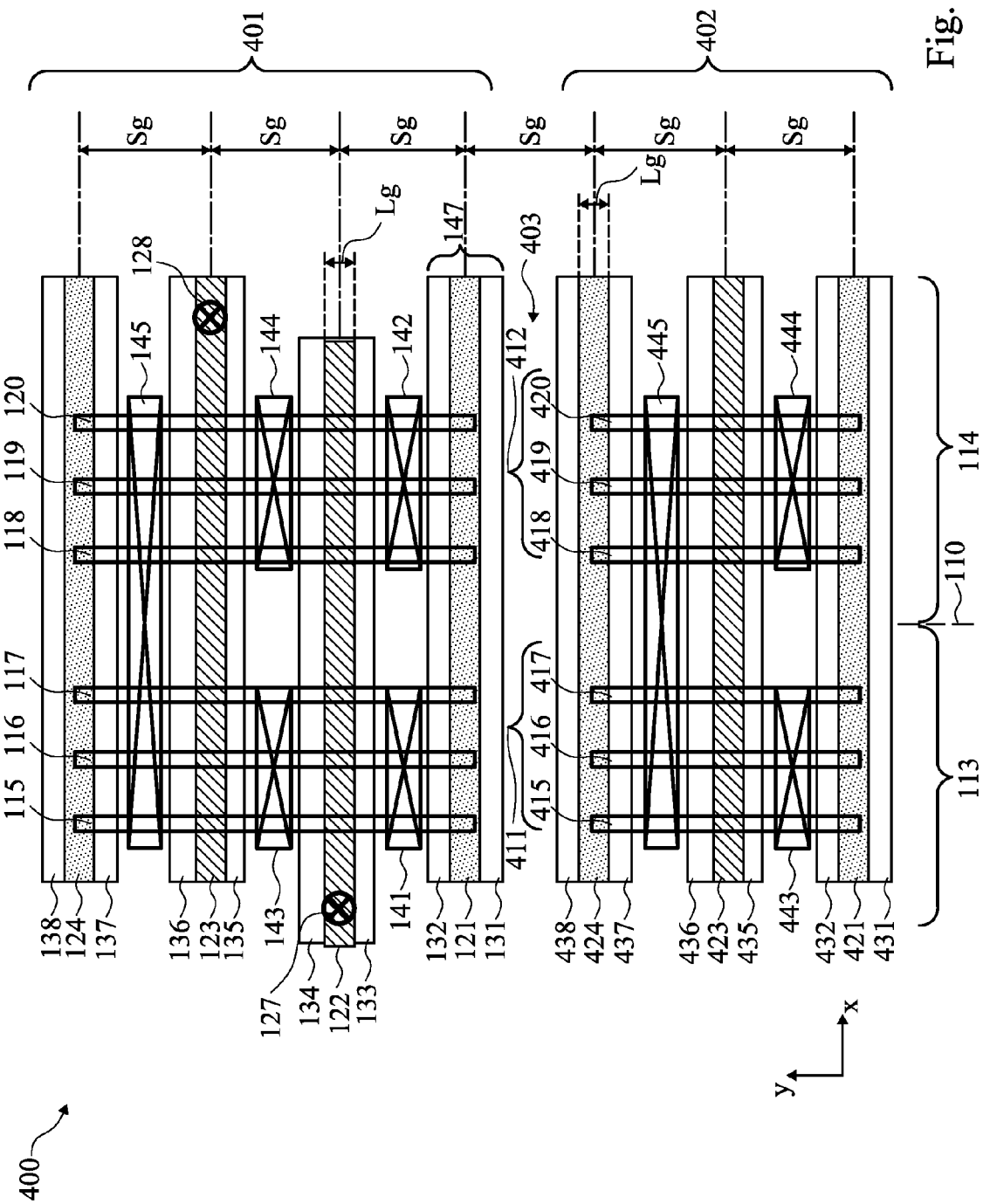
FIG. 4 is a top view of a layout of a semiconductor device, in accordance with some embodiments.

FIG. 4 is a top view of a layout 400 of a semiconductor device, in accordance with some embodiments. The layout 400 comprises a first circuit 401 and a second circuit 402. The first circuit 401 and the second circuit 402 is spaced from each other by a region 403 which includes, for example, an isolation structure.

In the example configuration in FIG. 4, the layout of first circuit 401 is the same as the layout 100 described with respect to FIG. 1. The second circuit 402 comprises a first active area region 411 with fins 415, 416, 417, a second active area region 412 with fins 418, 419, 420, a gate electrode 423, a plurality of dummy gates 421, 424, a plurality of spacers 431, 432, 435, 436, 437, 438, and a plurality of contact areas 443, 444, 445. In at least one embodiment, the active area regions 411, 412 correspond to the active area regions 111, 112, the fins 415-420 correspond to the fins 115-120, the gate electrode 423 corresponds to the gate electrode 123, the dummy gates 421, 424 correspond to dummy gates 121, 124 and are dielectric dummy gates, the spacers 431, 432, 435, 436, 437, 438 correspond to the spacers 131, 132, 135, 136, 137, 138, and the contact areas 443, 444, 445 correspond to the contact areas 143, 144, 145.

In the example configuration in FIG. 4, the active area region of the first circuit 401 is aligned with and spaced from the active area region of the second circuit 402. For example, the fin 115 of the first circuit 401 is aligned with the corresponding fin 415 of the second circuit 402 in the Y direction, and is spaced from the fin 415 by the region 403. The fins 115 and 415 is considered aligned when one fin, e.g., the fin 415, is located on an imaginary extension of the other fin, e.g., the fin 115. Similarly, the fins 116-120 of the first circuit 401 are aligned with the corresponding fins 416-420 of the second circuit 402 in the Y direction, and are spaced from the corresponding fins 416-420 by the region 403. In at least one embodiment, the region 403 provides electrical isolation between the first circuit 401 and the second circuit 402.

The first circuit 401 has an edge corresponding to the dummy gate 121, and the second circuit 402 has an adjacent edge corresponding to the dummy gate 424. In some embodiments, a spacing between the adjacent edges of the first circuit 401 and the second circuit 402, e.g., a center-to-center distance, or spacing, in the Y direction between the dummy gates 121 and 424 is equal to a spacing in the Y direction between the gate electrodes 122, 123 and/or equal to a spacing in the Y direction between the gate electrode 423 and the dummy gate 424. In at least one embodiment, all of the dummy gates and gate electrodes of the first circuit 401 and the second circuit 402 are spaced from each other by the same spacing Sg. In some embodiments, one or more effects described with respect to FIGS. 1, 1A, 1B, 2, 2A, and 3 are obtained in a semiconductor device having a layout or a configuration described with respect to FIG. 4.

Figure 5:
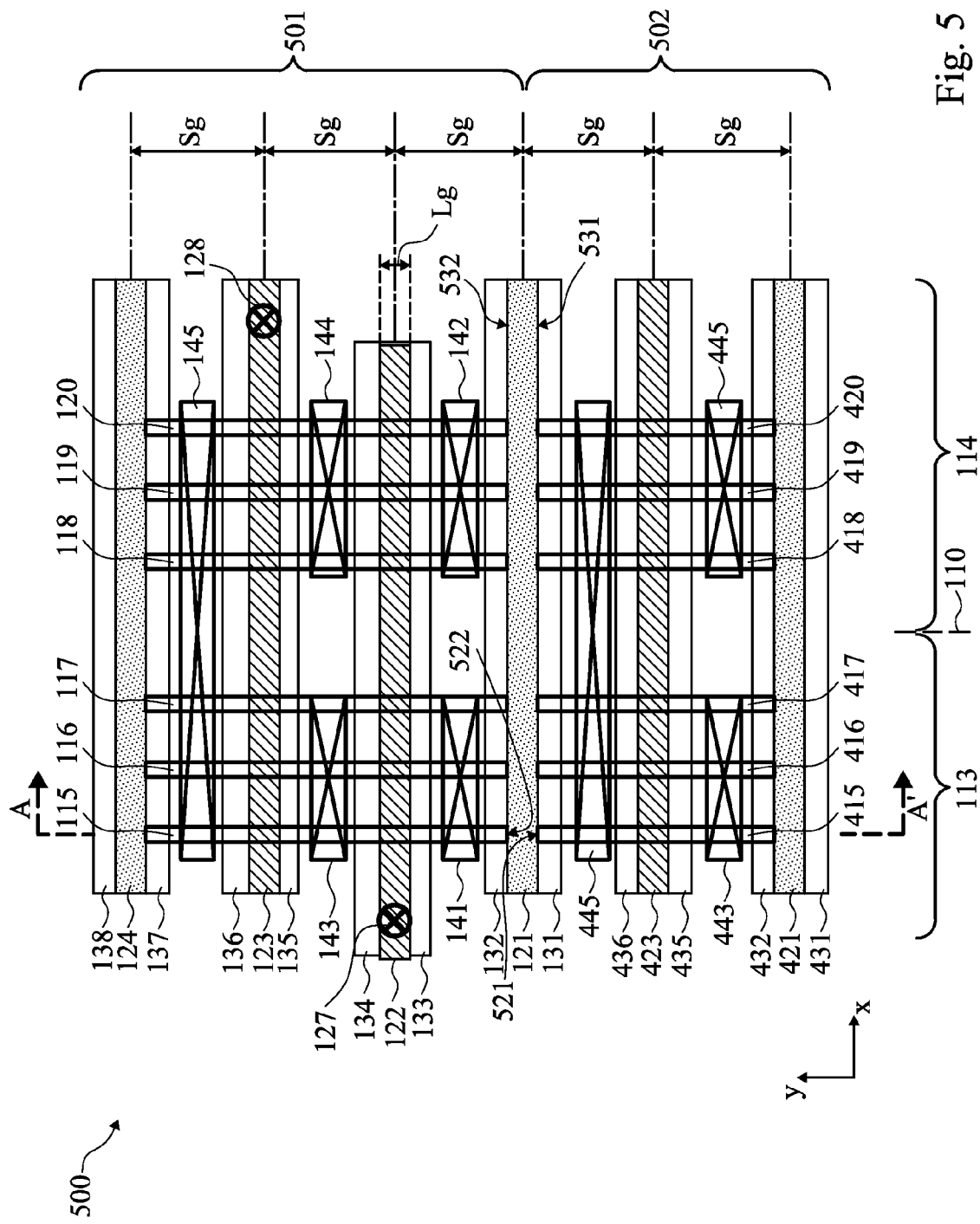
FIG. 5 is a top view of a layout of a semiconductor device, in accordance with some embodiments.

FIG. 5 is a top view of a layout 500 of a semiconductor device, in accordance with some embodiments. In some embodiments, a difference between the layout 500 in FIG. 5 and the layout 400 in FIG. 4 is that the region 403 of the layout 400 is omitted from the layout 500. The layout 500 comprises a first circuit 501 and a second circuit 502. The first circuit 501 corresponds to the first circuit 401 of FIG. 4. The second circuit 502 corresponds to the second circuit 402 of FIG. 4, with a difference in that the dummy gate 424 and the corresponding spacers 437, 438 of the second circuit 402 are omitted in the second circuit 502. The dummy gate 121 and the corresponding spacers 131, 132 of the first circuit 501 replace the omitted dummy gate 424 and the corresponding spacers 437, 438 in the second circuit 502. The dummy gate 121 corresponds to a common edge of the first circuit 501 and the second circuit 502 which abut each other. The first circuit 501 has a further edge corresponding to the dummy gate 124, and the second circuit 502 has a further edge corresponding to the dummy gate 421.

In some embodiments, to ensure electrical isolation between the active area regions of the first circuit 501 and the corresponding active area regions of the second circuit 502, the active area regions are terminated at, or in vicinities of, corresponding edges of the common dielectric dummy gate 121. In the example configuration in FIG. 5, an upper edge 521 of the fin 415 terminates at a corresponding lower edge 531 of the common dummy gate 121, and a lower edge 522 of the fin 115 terminates at a corresponding upper edge 532 of the common dummy gate 121. As a result, the upper edge 521 of the fin 415 and the lower edge 522 of the fin 115 are spaced and electrically isolated by the common dummy gate 121. Similarly, lower edges of the fins 116-120 terminate at the upper edge 532 of the common dummy gate 121, and are spaced and electrically isolated by the common dummy gate 121 from corresponding upper edges of the fins 416-420 which terminate at the lower edge 531 of the common dummy gate 121.

In the example configuration in FIG. 5, upper edges of the fins 115-120 terminate at a lower edge of the dummy gate 124, and lower edges of the fins 415-420 terminate at an upper edge of the dummy gate 421. Other arrangements are within the scope of various embodiments. For example, in at least one embodiment, the upper edges of the fins 115-120 extend upwardly beyond the lower edge of the dummy gate 124 and/or the lower edges of the fins 415-420 extend downwardly beyond the upper edge of the dummy gate 421, as in the layout 400.

The configuration described with respect to FIG. 5 is an example. Other arrangements are within the scope of various embodiments. For example, in some embodiments, one or more of the contact areas 141, 142, 143, 144, 145, 443, 444, 445 in the layout 500 are SACs, as described with respect to FIGS. 2 and 2A. In some embodiments, one or more further dummy gates are arranged adjacent the dummy gate 124 and/or the dummy gate 421. For example, a further dummy gate similar to the dummy gate 324 described with respect to FIG. 3 is arranged above and adjacent the dummy gate 124 in the layout 500. For another example, a further dummy gate similar to the dummy gate 321 described with respect to FIG. 3 is arranged below and adjacent the dummy gate 424 in the layout 500. In some embodiments, one or more of the further dummy gates is/are formed of a dielectric material. In some embodiments, one or more of the further dummy gates is/are formed of a conductive material.

Figure 5A:
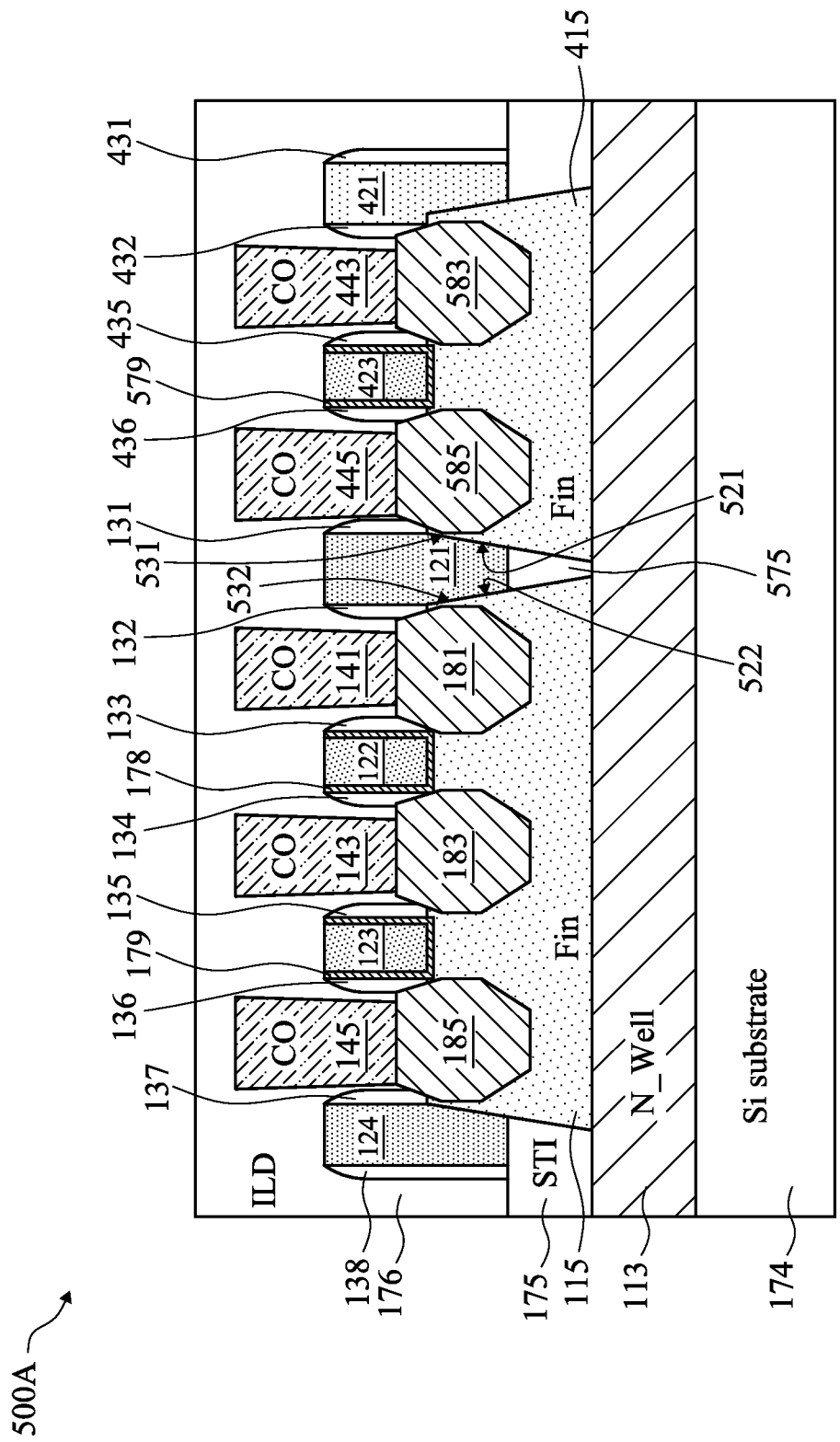
FIG. 5A is a cross-section view of a semiconductor device taken along line A-A' in FIG. 5 in accordance with some embodiments.

FIG. 5A is a cross-section view of a semiconductor device 500A taken along line A-A' in FIG. 5 in accordance with some embodiments. In the example configuration in FIG. 5A, the dummy gates 121, 124 and 421 include a dielectric material that is filled in the spaces between the corresponding spacers 131, 132, 137, 138, 431, 432, and in contact with the corresponding fins 115, 415, as described with respect to FIG. 2A. Other arrangements are within the scope of various embodiments. For example, in one or more embodiments, a gate dielectric layer is arranged around at least one of the dummy gates 121, 124 and 421, as described with respect to FIG. 1A. In the example configuration in FIG. 5A, a gate dielectric layer 579 is arranged between the gate electrode 423 on one side, and the corresponding spacers 435, 436 and the corresponding fin 415 on the other side. In some embodiments, the gate dielectric layer 579 includes the same dielectric material as the gate dielectric layers 178, 179 corresponding to the gate electrodes 122, 123. In some embodiments, the gate dielectric layer 579 includes a different dielectric material from the gate dielectric layers 178, 179.

In the example configuration in FIG. 5A, the fins 115, 515 terminate at corresponding edges of the common dummy gate 121. For example, an end 521 of the fin 415 terminates at, and is in contact with, an edge 531 of the common dummy gate 121. An end 522 of the fin 115 terminates at, and is in contact with, an edge 532 of the common dummy gate 121. The edges 531, 532 of the dummy gate 121 are at a lower portion of the dummy gate 121 which is located between, and electrically isolates, an upper portion of the fin 115 and an upper portion of the fin 415. A portion 575 of the isolation structure 175 is arranged between, and electrically isolates, a lower portion of the fin 115 and a lower portion of the fin 415. The dummy gate 121 further has an upper portion arranged between the corresponding spacers 131, 132. The upper and lower portions of the dummy gate 121 are continuous to each other. A bottom face of the dummy gate 121 is in contact with a top face of the portion 575 of the isolation structure 175.

In at least one embodiment, by configuring a dielectric dummy gate at a common edge of abutting circuits as described with respect to FIG. 5, the number of dummy gates in the layout of a semiconductor device is reduced. In at least one embodiment, compared to the layout 400, the layout 500 achieves an area reduction of up to 10%. As a result, a more compact semiconductor device with lower manufacturing cost and/or time is obtainable in one or more embodiments. In some embodiments, one or more effects described with respect to FIGS. 1, 1A, 1B, 2, 2A, 3 and 4 are obtained in a semiconductor device having a layout or a configuration described with respect to FIGS. 5 and 5A.

FIGS. 6A-6F are cross-section views of a semiconductor device at various manufacturing stages of the semiconductor device, in accordance with some embodiments. The cross-section views in FIGS. 6A-6F are taken along a cross-section line similar to line A-A' in FIG. 5. In the example configurations described with respect to FIGS. 6A-6F, the semiconductor device comprises FinFET devices. Other arrangements, such as planar MOS devices, are within the scope of various embodiments.

Figure 6A:
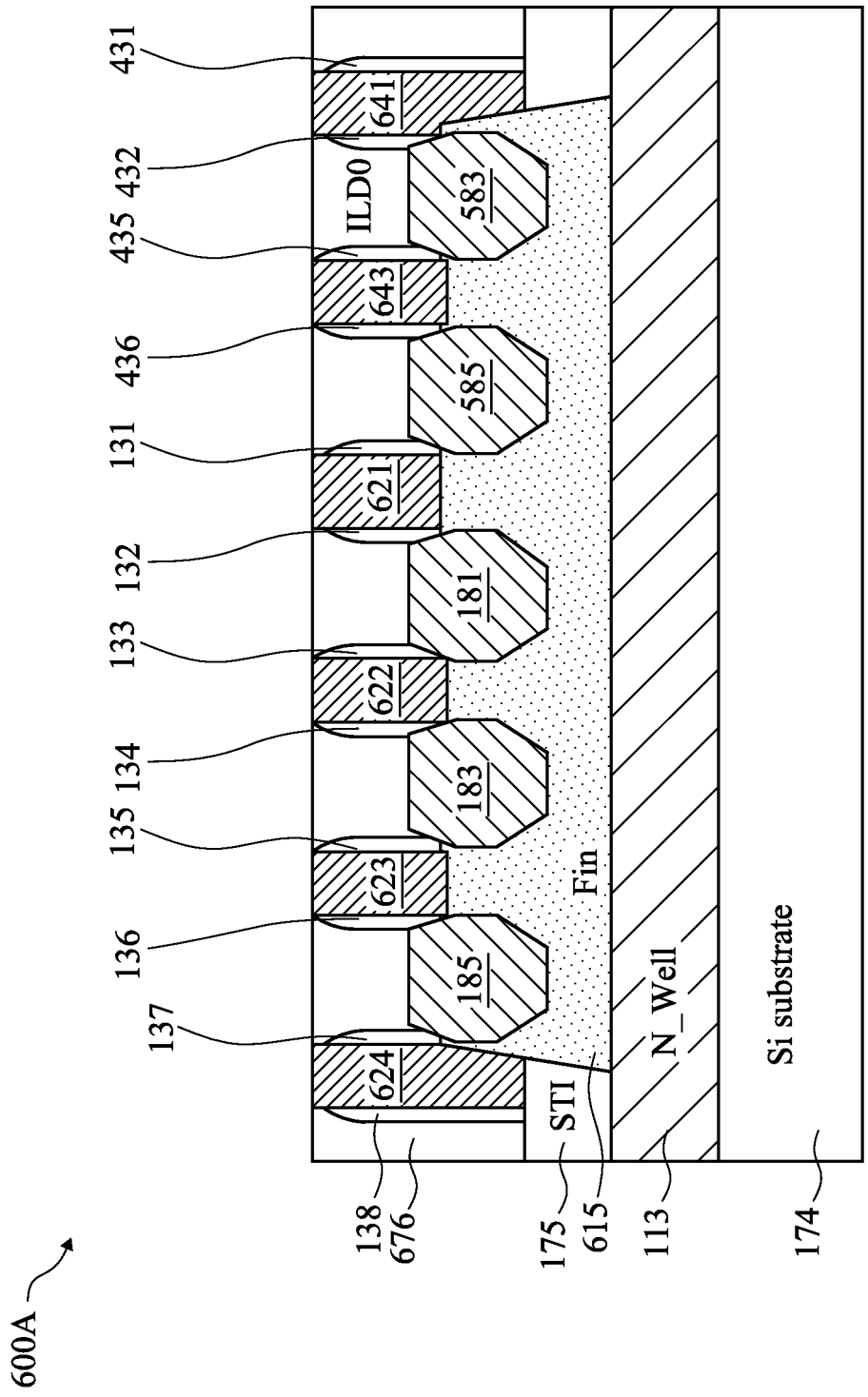
FIGS. 6A-6F are cross-section views of a semiconductor device at various manufacturing stages of the semiconductor device, in accordance with some embodiments.

As illustrated in FIG. 6A, a n-well region 113 is formed in a substrate 174. A p-well region 114 (not shown in FIG. 6A) is also formed in the substrate 174. In at least one embodiment, the n-well region 113 and p-well region 114 are formed by doping the substrate 174 with corresponding n-type and p-type dopants by ion implantation. Example p-type dopants include, but are not limited to, boron or $BF_2$. Example n-type dopants include, but are not limited to, phosphorus and arsenic.

A plurality of fins is formed over the n-well region 113 and p-well region 114. FIG. 6A shows a fin 615 over the n-well region 113. Example materials of the fins include, but are not limited to, silicon, germanium or compound semiconductor. The fins are formed by one or more suitable process including, but not limited to, deposition, photolithography, and/or etching processes. In an example, the fins are formed by patterning and etching a portion of the silicon substrate 174. In another example, the fins are formed by patterning and etching a silicon layer deposited overlying an insulator layer (for example, an upper silicon layer of a silicon-insulator-silicon stack of an SOI substrate).

One or more isolation structures 175 are formed over the substrate 174 to define and electrically isolate the fins. In one example, the isolation structures 175 include local oxidation of silicon (LOCOS) and/or shallow trench isolation (STI)

regions. Example materials of the isolation structures 175 include, but are not limited to, silicon oxide, silicon nitride, silicon oxynitride, fluoride-doped silicate glass (FSG), a low-K dielectric material, and/or combinations thereof. In an example, the formation of the isolation structures 175 includes filling trenches between the fins, for example, by a chemical vapor deposition (CVD) process, with a dielectric material. In some embodiments, the filled trench has a multi-layer structure, such as a thermal oxide liner layer filled with silicon nitride or silicon oxide. In at least one embodiment, a height of the fins exposed from the isolation structure 175 is between 25 nm and 50 nm.

In at least one embodiment, a p-type species doped process and an n-type species doped process are performed after the formation of the isolation structure 175. The p-type species doped process comprises a p-well lithography patterning, a p-well doped formation and a p-type channel doping for n-type devices, such as NMOSFETs. The n-type species doped process comprises an n-well lithography pattering, an n-well doped formation and an n-type channel doping for p-type devices, such as PMOSFETs.

A plurality of gates 621, 622, 623, 624, 641, 643 is formed over the substrate 174, crossing the fins. Example materials of the gates include, but are not limited to, poly-silicon, and doped poly-silicon with uniform or non-uniform doping. In one or more embodiments, the poly-silicon is doped for proper conductivity in a gate-first process where one or more of the gates 622, 623, 643 remain and configure the corresponding gate electrodes 122, 123, 423 in the manufactured semiconductor device. In one or more embodiments, the poly-silicon is not doped where one or more of the gates 621, 622, 623, 624, 641, 643 are sacrificial gates to be replaced in a gate replacement (gate-last) process. The gates 621, 622, 623, 624, 641, 643 are referred to herein as poly gates. In some embodiments, gate dielectric layers are formed under the poly gates. In one or more embodiments, the poly gates are formed by depositing a poly-silicon layer over the substrate 174 with the fins and the isolation structures 175 thereon, in a low-pressure chemical vapor deposition (LP-CVD) process or a plasma-enhanced chemical vapor deposition (PECVD) process. In an example, a layer of photoresist is formed over the poly-silicon layer by a suitable process, such as, spin-on coating. The layer of photoresist is patterned to form patterned photoresist features by a proper lithography patterning process. The patterned photoresist features are then transferred by a dry etching process to the underlying poly-silicon layer to form the poly gates. The patterned photoresist layer is stripped thereafter.

In another example, a first hard mask layer is formed over the poly-silicon layer, a patterned photoresist layer is formed over the hard mask layer, and the pattern of the photoresist layer is transferred to the first hard mask layer and the poly-silicon layer. As a result, the poly gates and corresponding hard masks over the top surfaces of the poly gates are formed. Example materials of the hard masks include, but are not limited to, silicon oxide, silicon nitride, silicon oxynitride, and/or other suitable dielectric materials. The hard mask layer is formed in one or more embodiments by a method such as chemical vapor deposition (CVD) or physical vapor deposition (PVD).

A plurality of spacers is formed over sidewalls of the corresponding poly gates. In at least one embodiment, the spacers formed over the sidewalls of the poly gates correspond to the spacers 131-138, 431, 432, 435, 436, 437, 438 described with respect to FIGS. 1, 1A, 1B, 4, 5 and 5A. Spacers 131-138, 431, 432, 435, 436 are designated in FIG. 6A, for example. In one example, a dielectric layer is formed over the poly gates and the substrate 174, and covers sidewalls of the poly gates. Example dielectric materials include, but are not limited to, silicon oxide, silicon nitride, and silicon oxy-nitride. The dielectric layer is formed by CVD, PVD, atomic layer deposition (ALD), or other suitable technique. An anisotropic etching is performed on the dielectric layer to form pairs of spacers on opposite sidewalls of the corresponding poly gates.

Source/drain (SD) regions are formed over the fins and between the facing spacers of the adjacent poly gates. In one or more embodiments, portions of the fins, e.g., the fin 615, between the facing spacers of the adjacent poly gates are recessed to form S/D cavities having bottom surfaces lower than the top surface of the fin 615. For example, a biased etching process is performed to form the S/D cavities, using the hard masks on top of the poly gates and the spacers as etching masks. After the formation of the S/D cavities, S/D regions are produced by epi-growing a strained material in the S/D cavities as described herein. In some embodiments, a pre-cleaning process is performed to clean the S/D cavities with HF or other suitable solution. Then, the strained material, such as silicon germanium (SiGe) is selectively grown by an LPCVD process to fill the S/D cavities. S/D regions 181, 183, 185, 583, 585 are designated in FIG. 6A, for example.

An ILD layer 676 (designated in FIG. 6A as "ILD0") is deposited over the substrate 174 having the poly gates, spacers, fins and S/D regions thereon. Example materials of the ILD0 layer 676 include, but are not limited to, silicon oxide, spin-on glass (SOG), fluorinated silica glass (FSG), carbon doped silicon oxide, other suitable dielectric materials, and/or combinations thereof. In some embodiments, the ILD0 layer 676 is formed by a high density plasma (HDP) process. In one or more embodiments, the ILD0 layer 676 is planarized by a chemical mechanical polishing (CMP) process to remove a thickness of the ILD0 layer 676 and the hard masks on tops of the poly gates, and to expose top surfaces of the poly gates. A resulting structure 600A is obtained as illustrated in FIG. 6A.

Figure 6B:
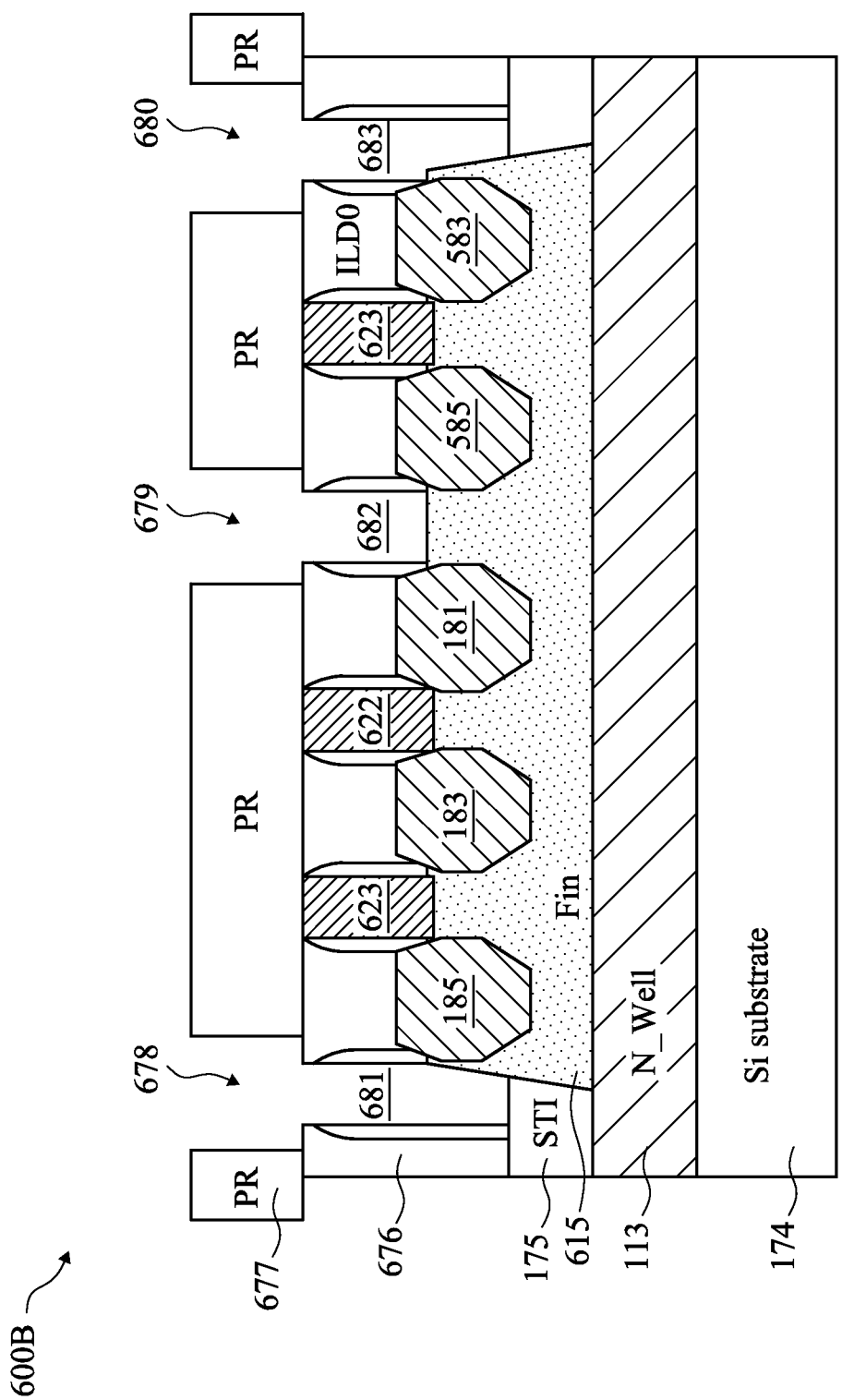

As illustrated in FIG. 6B, the poly gates corresponding to dielectric dummy gates in the semiconductor device being manufactured are removed. In at least one embodiment, a photoresist layer 677 (designated as "PR" in FIG. 6B) is deposited over the structure 600A by a suitable process, such as spin-on coating. The photoresist layer 677 is patterned to form openings 678, 679, 680 over the poly gates 624, 621, 641 where dielectric dummy gates are to be formed. The photoresist layer 677 covers the poly gates 623, 622, 643 corresponding to gate electrodes in the semiconductor device being manufactured. The exposed poly gates 624, 621, 641 are removed, for example, by a wet etch and/or a dry etching process, to form corresponding openings 681, 682, 683 between the corresponding pairs of spacers (which, for simplicity, are not designated with reference numerals in FIG. 6B). In the poly gate etching, the photoresist layer 677 and the ILD0 layer 676 are used as etching masks. In at least one embodiment, the gate dielectric layers formed under the poly gates 624, 621, 641 remain in the openings 681, 682, 683 between the corresponding pairs of spacers. In at least one embodiment, the gate dielectric layers formed under the poly gates 624, 621, 641 are removed to expose underlying portions of the fin 615 and the isolation structure 175. A resulting structure 600B is obtained as illustrated in FIG. 6B.

Figure 6C:
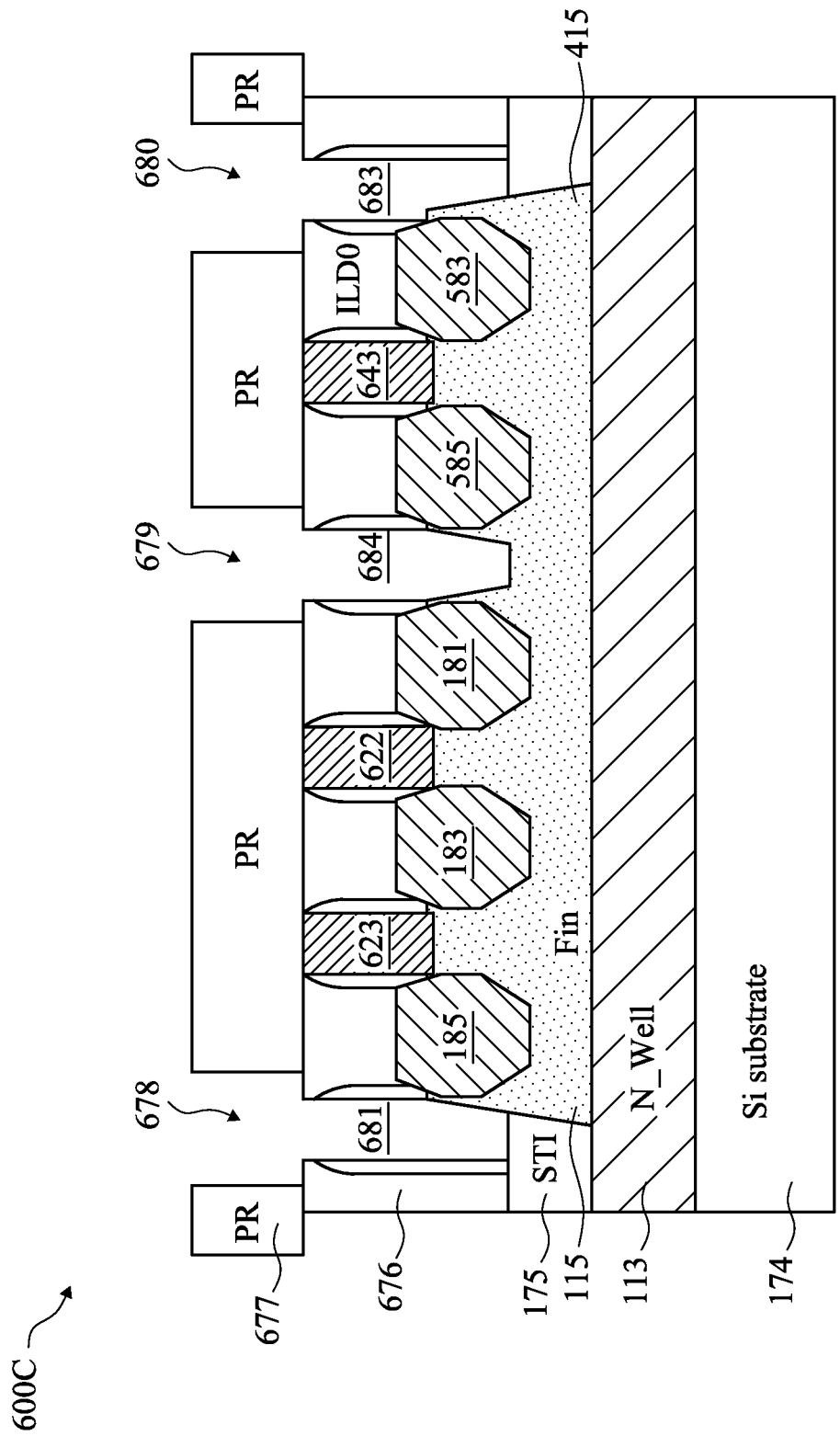

A selective fin etching process is performed in one or more embodiments to break a fin into smaller fins for different circuits. For example, as illustrated in FIG. 6C, an Si etching process is performed to further deepen the opening 682 and remove at least partially a portion of the fin 615. A resulting opening 684 is obtained and split the fin 615 into the fins 115 and 415. In at least one embodiment, the fin etching process includes a self-aligned etch using the same etching mask, i.e., the photoresist layer 677 and the ILD0 layer 676, as the etching mask used in the poly gate etching described with respect to FIG. 6B. As a result, an additional mask and associated cost is avoidable in at least one embodiment. In at least one embodiment, the described selective fin etching process is omitted. A resulting structure 600C is obtained as illustrated in FIG. 6C. In at least one embodiment, the selective fin etching process described with respect to FIG. 6C is omitted.

Figure 6D:
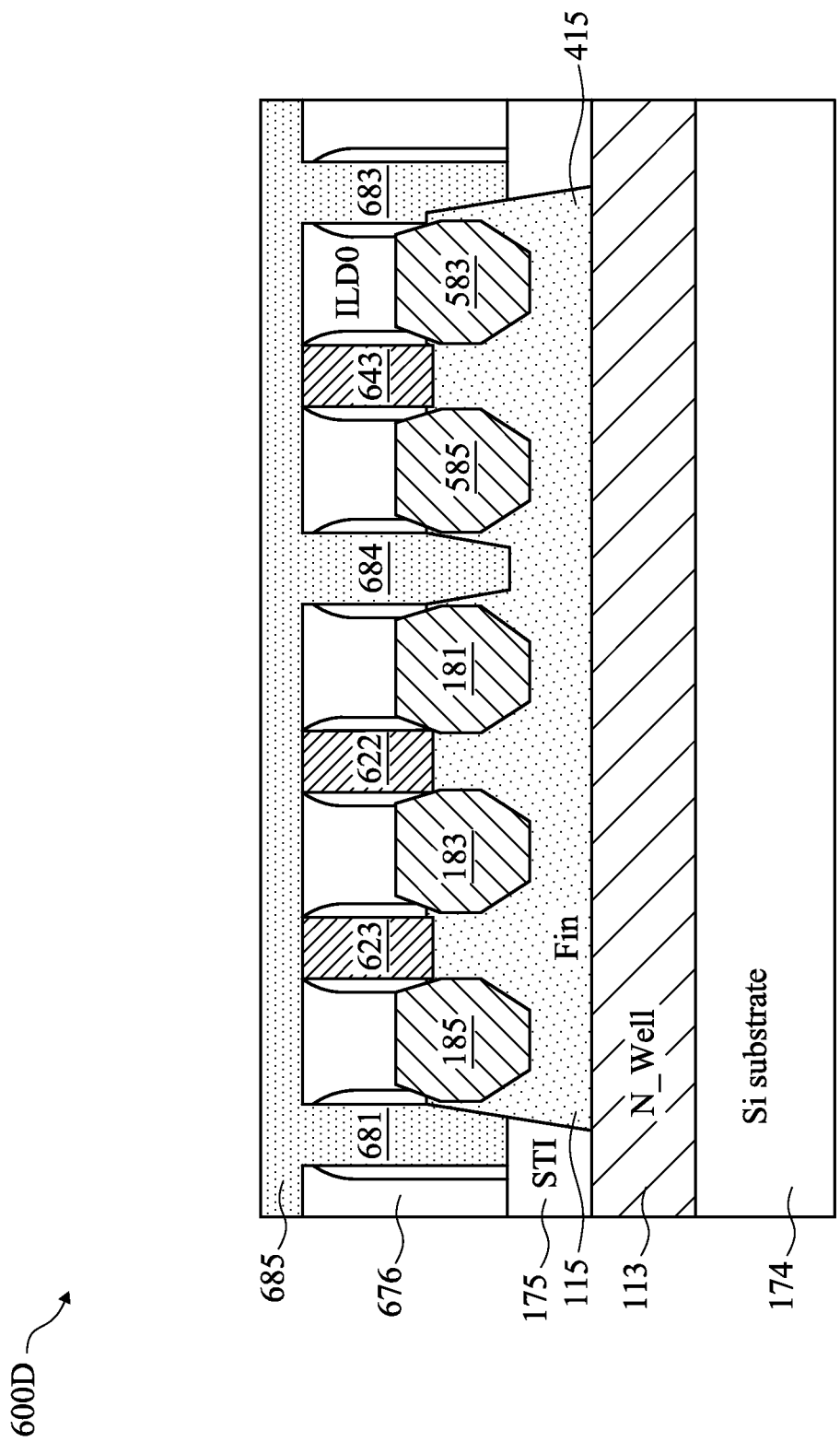

As illustrated in FIG. 6D, a dielectric material 685 is formed over the structure 600C and fills in the openings 681, 683, 684. A resulting structure 600D is obtained as illustrated in FIG. 6D.

Figure 6E:
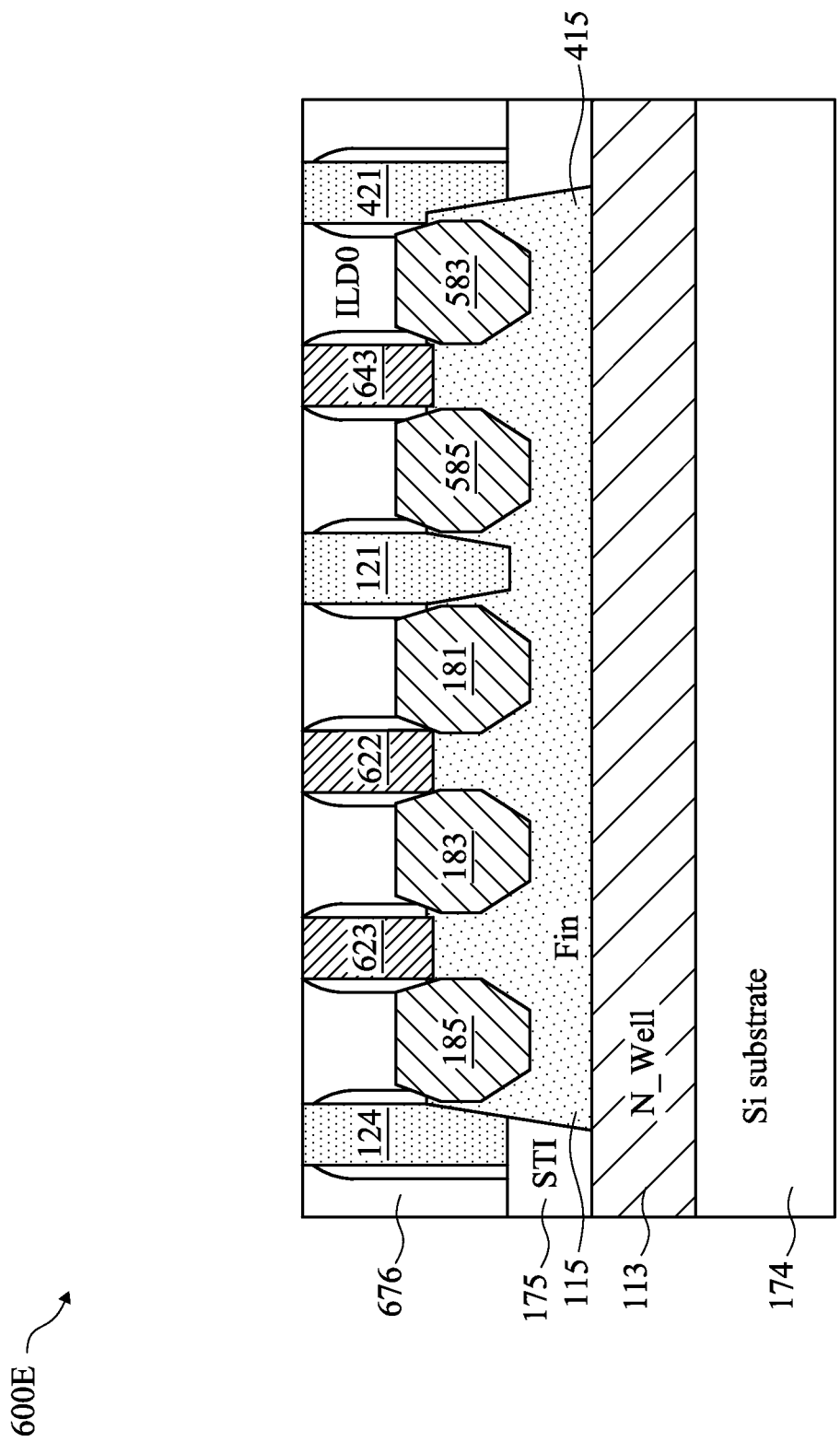

As illustrated in FIG. 6E, a CMP process is performed to planarize the deposited dielectric material 685. The dielectric material remaining in the openings 681, 683, 684 configure corresponding dielectric dummy gates 124, 121 and 421 as described herein. A resulting structure 600E is obtained as illustrated in FIG. 6E. In at least one embodiment, the CMP process described with respect to FIG. 6E is omitted.

Figure 6F:
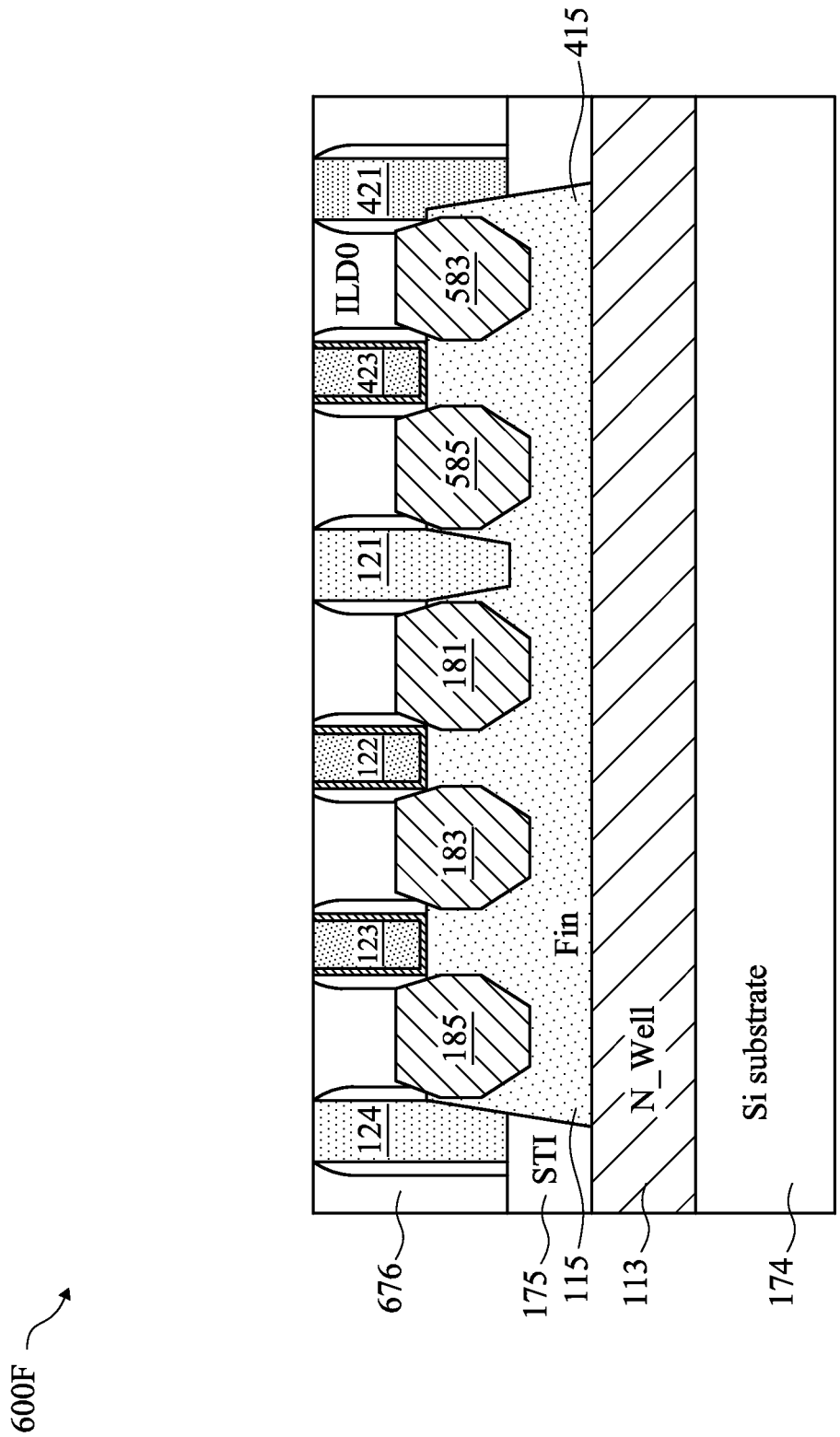

As illustrated in FIG. 6F, the poly gates 623, 622, 643 are selectively removed to form openings that expose the underlying fins. One or more conductive materials of the corresponding replacement gate electrodes 123, 122, 423 are filled in the openings over the remaining gate dielectric layers previously formed under the poly gates. In at least one embodiment, the gate dielectric layers formed under the poly gates are also removed and new gate dielectric layers are deposited in the openings between the corresponding pairs of spacers. In some embodiments, the conductive materials of the gate electrodes 123, 122, 423 include a work function layer and/or a contact layer as described herein. A planarization process is performed to remove the conductive materials outside the gate electrodes 123, 122, 423. A resulting structure 600F is obtained as illustrated in FIG. 6F.

Further processes, such as a gate contact formation process and a S/D contact formation process, are performed in one or more embodiments. Examples of a gate contact formation process and a S/D contact formation process are described in U.S. application Ser. No. 14/598,268, which is incorporated by reference herein in its entirety. In some embodiments, the manufacturing processes described with respect to FIGS. 6A-6F are applicable to semiconductor devices described with respect to FIGS. 1A, 1B, 2A and 5A, as described herein.

Figure 7:
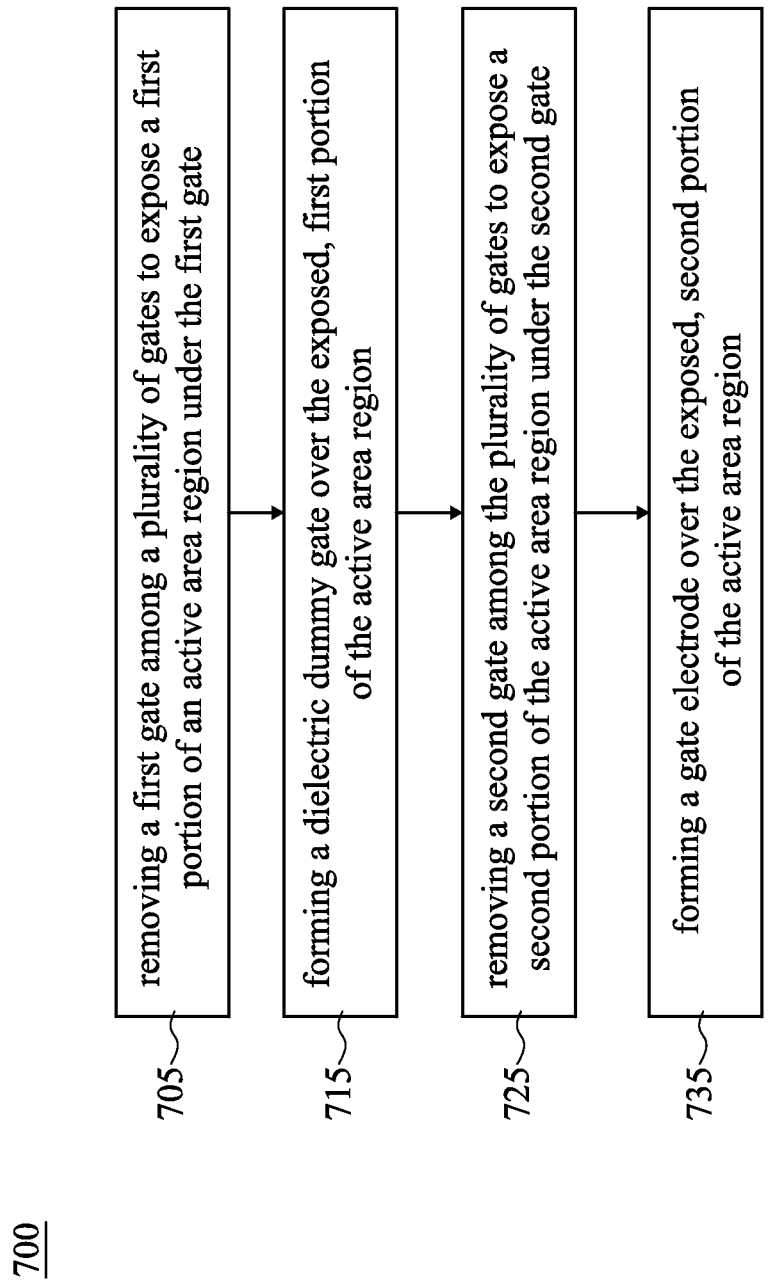
FIG. 7 is a flow chart of a method of manufacturing a semiconductor device, in accordance with some embodiments.

FIG. 7 is a flow chart of a method 700 of manufacturing a semiconductor device, in accordance with some embodiments.

At operation 705, a first gate among a plurality of gates is removed to expose a first portion of an active area region under the first gate. For example, as described with respect to FIGS. 6A-6C, poly gates 624, 621, 641 are removed to form openings 681, 682/684, 683 that expose a first portion of active area region or fin 615. In at least one embodiment, an end-cut removing process for gate electrodes is performed together with operation 705. An end-cut removing or patterning process is performed to define the ends of one or more of the gate electrodes. A manufacturing process in accordance with some embodiments further includes a line-cut patterning process performed to define gate lines of the one or more gate electrodes.

At operation 715, a dielectric dummy gate is formed over the exposed, first portion of the active area region. For example, as described with respect to FIGS. 6D-6E, dielectric dummy gates 124, 121, 421 are formed in the openings 681, 682/684, 683 over the exposed area of the fin 615.

At operations 725-735, a second gate among the plurality of gates is removed to expose a second portion of the active area region under the second gate, and a gate electrode is formed over the exposed, second portion of the active area region. For example, as described with respect to FIG. 6F, the poly gates 623, 622, 643 are selectively removed to form openings that expose the underlying fins, and the corresponding gate electrodes 123, 122, 423 are filled in the openings over the exposed portions of the underlying fins.

Embodiments that combine different features and/or different embodiments are within the scope of the disclosure and will be apparent to those of ordinary skill in the art after reviewing various embodiments.

Some embodiments provide a semiconductor device or semiconductor device layout in which dummy gates are formed of a dielectric material. As a result, capacitances and gate dielectric breakdown risks are reduced, thereby improving one or more of reliability, performance, and power consumption in one or more embodiments.

In some embodiments, a layout of a semiconductor device is stored on a non-transitory computer-readable medium. The layout comprises an active area region extending in a first direction, a gate electrode extending in a second direction and crossing the active area region, and a dummy gate extending in the second direction. The dummy gate is adjacent the gate electrode. The dummy gate is a dielectric dummy gate.

In some embodiments, a semiconductor device comprises a substrate, first and second active area regions over the substrate and extending in a first direction, first and second gate electrodes over the substrate and extending in a second direction, an isolation structure over the substrate, and a dummy gate over the isolation structure and extending in the second direction. The first and second gate electrodes cross the corresponding first and second active area regions. The dummy gate is a dielectric dummy gate. The first active area region and the second active area region are aligned in the first direction, and spaced from each other by the dielectric dummy gate.

In a method of manufacturing a semiconductor device in accordance with some embodiments, a first gate among a plurality of gates over a substrate is removed to expose a first portion of an active area region under the first gate. A dielectric dummy gate is formed over the exposed, first portion of the active area region. A second gate among the plurality of gates is removed to expose a second portion of the active area region under the second gate. A gate electrode is formed over the exposed, second portion of the active area region.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of a semiconductor device, the layout stored on a non-transitory computer-readable medium and comprising:
   an active area region extending in a first direction;
   a gate electrode extending in a second direction, and crossing the active area region; and
   a dummy gate extending in the second direction, the dummy gate adjacent the gate electrode,
   wherein the dummy gate is a dielectric dummy gate.

2. The layout of claim 1, further comprising:
   a transistor comprising the active area region and the gate electrode,
   wherein the transistor has a source or drain region formed over the active area region between the gate electrode and the dummy gate.

3. The layout of claim 1, further comprising:
   spacers extending in the second direction over sidewalls of the gate electrode and the dummy gate,
   wherein the dummy gate comprises at least one dielectric material filled in a space between the corresponding spacers.

4. The layout of claim 3, further comprising:
   a dummy gate region comprising the dummy gate and the corresponding spacers,
   wherein the active area region terminates in the dummy gate region.

5. The layout of claim 1, further comprising:
   a further gate electrode extending in the second direction, and crossing the active area region,
   wherein
   the gate electrode is between the further gate electrode and the dummy gate, and
   a distance between the gate electrode and the dummy gate is equal to a distance between the gate electrode and the further gate electrode.

6. The layout of claim 1, further comprising:
   a further dummy gate extending in the second direction, and adjacent the dummy gate,
   wherein the dummy gate is between the further dummy gate and the gate electrode.

7. The layout of claim 6, wherein
   the further dummy gate is a dielectric dummy gate.

8. The layout of claim 6, wherein
   the further dummy gate is a conductive dummy gate.

9. The layout of claim 6, wherein
   a distance between the gate electrode and the dummy gate is equal to a distance between the dummy gate and the further dummy gate.

10. The layout of claim 6, further comprising:
    a further gate electrode extending in the second direction, and adjacent the further dummy gate; and
    a further active area region extending in the first direction, and crossing the further gate electrode,
    wherein
    the active area region and the further active area region are aligned and spaced from each other in the first direction, and
    the further dummy gate is between the further gate electrode and the dummy gate.

11. A semiconductor device, comprising:
    a substrate;
    first and second active area regions over the substrate and extending in a first direction;
    first and second gate electrodes over the substrate and extending in a second direction, the first and second gate electrodes crossing the corresponding first and second active area regions;
    an isolation structure over the substrate; and
    a dummy gate over the isolation structure and extending in the second direction,
    wherein
    the dummy gate is a dielectric dummy gate, and
    the first active area region and the second active area region are aligned in the first direction, and spaced from each other by the dielectric dummy gate.

12. The semiconductor device of claim 11, wherein
    the first active area region and the second active area region have opposing ends facing each other in the first direction, and
    the dielectric dummy gate is between and in contact with the opposing ends of the first and second active area regions.

13. The semiconductor device of claim 11, further comprising:
    a plurality of spacers along sides of the corresponding first and second gate electrodes and dielectric dummy gate,
    wherein
    the first active area region and the second active area region have opposing ends facing each other in the first direction, and
    the dielectric dummy gate comprises at least one dielectric material filled in
       a first space between the corresponding spacers, and
       a second space below the first space and between the opposing ends of the first and second active area regions.

14. The semiconductor device of claim 11, wherein
    a width of the first or second gate electrode in the first direction is equal to a width of the dielectric dummy gate in the first direction.

15. The semiconductor device of claim 11, wherein
    a distance between the first gate electrode and the dielectric dummy gate is equal to a distance between the dielectric dummy gate and the second gate electrode.

16. The semiconductor device of claim 11, further comprising:
    a first circuit comprising the first active area region and the first gate electrode; and
    a second circuit comprising the second active area region and the second gate electrode,
    wherein
    the first and second circuits share a common edge corresponding to the dielectric dummy gate, and
    at least one of the first circuit or the second circuits has
       a further edge opposite to the common edge in the first direction,
       a further dielectric dummy gate corresponding to the further edge, and
       spacers along sides of the further dielectric dummy gate, wherein the corresponding active area region terminates in a dielectric dummy gate region including the further dielectric dummy gate and the corresponding spacers.

17. The semiconductor device of claim 16, further comprising:
    another dummy gate adjacent the further dielectric dummy gate in the first direction.

18. A semiconductor device, comprising:
    a substrate;
    a fin structure over the substrate, wherein the fin structure extends in a first direction parallel to a top surface of the substrate;

an isolation structure over the substrate;

a gate electrode over the fin structure, wherein the gate electrode comprises a conductive material, and the gate electrode extends in a second direction perpendicular to the first direction; and a gate structure over the isolation structure and the fin structure, wherein the gate structure is free of conductive materials, and the gate structure extends in the second direction.

19. The semiconductor device of claim 18, wherein the gate structure comprises:

a gate dielectric material; and a dummy dielectric material, wherein the gate dielectric material is between the dummy dielectric material and the fin structure.

20. The semiconductor device of claim 18, wherein the gate structure comprises:

spacers defining an area between the spacers; and a dummy dielectric material filling the area, wherein the dummy dielectric material directly contacts the fin structure.

* * * * *